(12) United States Patent
Ouderkirk et al.

(10) Patent No.: US 11,953,702 B1
(45) Date of Patent: Apr. 9, 2024

(54) NANOVOIDED GRADED-INDEX OPTICAL ELEMENTS, OPTICAL ARRAYS, AND METHODS OF FORMING THE SAME

(71) Applicant: Meta Platforms Technologies, LLC, Menlo Park, CA (US)

(72) Inventors: Andrew John Ouderkirk, Kirkland, WA (US); Kenneth Alexander Diest, Kirkland, WA (US); Renate Eva Klementine Landig, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/822,367

(22) Filed: Aug. 25, 2022

Related U.S. Application Data

(62) Division of application No. 16/426,737, filed on May 30, 2019, now Pat. No. 11,448,798.

(Continued)

(51) Int. Cl.
*G02B 3/00* (2006.01)
*B29D 11/00* (2006.01)
(Continued)

(52) U.S. Cl.
CPC .......... *G02B 3/00* (2013.01); *B29D 11/00355* (2013.01); *G02B 1/041* (2013.01); *G02B 3/0012* (2013.01); *G02B 5/045* (2013.01); *G02B 27/0172* (2013.01); *B29K 2105/04* (2013.01); *B29K 2995/0026* (2013.01); *G02B 3/0087* (2013.01); *G02B 2027/0178* (2013.01); *G02B 2207/101* (2013.01); *G02B 2207/107* (2013.01)

(58) Field of Classification Search
None
See application file for complete search history.

(56) References Cited

U.S. PATENT DOCUMENTS 3,215,583 A 11/1965 Holme
3,985,599 A 10/1976 Lepoutre et al.
(Continued)

FOREIGN PATENT DOCUMENTS

CA 2737458 A1 3/2010
CN 1870930 A 11/2006
(Continued)

OTHER PUBLICATIONS

Office Action dated Mar. 28, 2023 for Chinese Application No. 201980082380.9, filed Jun. 11, 2021, 12 pages.
(Continued)

*Primary Examiner* — Stephone B Allen
*Assistant Examiner* — Tamara Y. Washington
(74) *Attorney, Agent, or Firm* — Greenberg Traurig, LLP

(57) ABSTRACT

A graded-index optical element may include a nanovoided material including a first surface and a second surface opposite the first surface. The nanovoided material may be transparent between the first surface and the second surface. Additionally, the nanovoided material may have a predefined change in effective refractive index in at least one axis due to a change in at least one of nanovoid size or nanovoid distribution along the at least one axis. Various other elements, devices, systems, materials, and methods are also disclosed.

6 Claims, 18 Drawing Sheets

Related U.S. Application Data

(60) Provisional application No. 62/777,825, filed on Dec. 11, 2018.

(51) Int. Cl.
*G02B 1/04* (2006.01)
*G02B 5/04* (2006.01)
*G02B 27/01* (2006.01)
*B29K 105/04* (2006.01)

(56) References Cited

U.S. PATENT DOCUMENTS

| | | |
|---|---|---|
| 4,613,544 A | 9/1986 | Burleigh |
| 5,095,515 A | 3/1992 | Seaver |
| 6,376,971 B1 | 4/2002 | Pelrine et al. |
| 6,420,441 B1 | 7/2002 | Allen et al. |
| 6,488,721 B1 | 12/2002 | Carlson |
| 6,628,850 B1 | 9/2003 | Yao |
| 6,930,439 B2 | 8/2005 | Wierach |
| 7,002,754 B2 | 2/2006 | Baer et al. |
| 7,230,771 B2 | 6/2007 | Kuiper et al. |
| 7,298,017 B1 | 11/2007 | Liu et al. |
| 7,573,064 B2 | 8/2009 | Benslimane et al. |
| 7,733,000 B2 | 6/2010 | Kudoh |
| 7,872,396 B2 | 1/2011 | Chiang et al. |
| 7,880,371 B2 | 2/2011 | Benslimane et al. |
| 7,999,435 B2 | 8/2011 | Chiang et al. |
| 8,247,946 B2 | 8/2012 | Chiang et al. |
| 8,368,285 B2 | 2/2013 | Chiang et al. |
| 8,477,402 B2 | 7/2013 | Duncan et al. |
| 8,564,181 B2 | 10/2013 | Choi et al. |
| 8,848,280 B2 | 9/2014 | Arsenault |
| 9,228,822 B2 | 1/2016 | Majidi et al. |
| 9,478,727 B2 | 10/2016 | Bose et al. |
| 9,618,739 B2 | 4/2017 | Brokken et al. |
| 9,761,790 B2 | 9/2017 | Yoo et al. |
| 9,820,481 B2 | 11/2017 | Hani et al. |
| 9,876,160 B2 | 1/2018 | Biggs et al. |
| 9,923,180 B2 | 3/2018 | Thomas-Alyea et al. |
| 10,036,674 B2 | 7/2018 | Orita |
| 10,629,800 B2 | 4/2020 | Gong et al. |
| 10,670,782 B2 | 6/2020 | Arbabi et al. |
| 10,690,946 B2 | 6/2020 | Wilson |
| 10,749,448 B2 | 8/2020 | Lindsay et al. |
| 10,797,217 B2 | 10/2020 | Hakkens et al. |
| 11,022,856 B1 | 6/2021 | Ouderkirk et al. |
| 11,025,175 B1 | 6/2021 | Landig et al. |
| 11,256,331 B1 | 2/2022 | Diest et al. |
| 2002/0009251 A1 | 1/2002 | Byrne |
| 2002/0135863 A1 | 9/2002 | Fukshima et al. |
| 2002/0186928 A1 | 12/2002 | Curtis |
| 2005/0007675 A1 | 1/2005 | Matsumoto et al. |
| 2005/0196552 A1 | 9/2005 | Lehmann et al. |
| 2006/0024976 A1 | 2/2006 | Waldfried et al. |
| 2006/0028734 A1 | 2/2006 | Kuiper et al. |
| 2007/0020404 A1 | 1/2007 | Seiberle et al. |
| 2007/0152982 A1 | 7/2007 | Kim et al. |
| 2007/0205398 A1 | 9/2007 | Smela et al. |
| 2007/0263963 A1 | 11/2007 | Hughes et al. |
| 2008/0043515 A1 | 2/2008 | Bloch |
| 2008/0137031 A1 | 6/2008 | Hillis et al. |
| 2008/0171431 A1 | 7/2008 | Yu et al. |
| 2008/0197518 A1 | 8/2008 | Aylward et al. |
| 2008/0224103 A1 | 9/2008 | Arsenault et al. |
| 2008/0257718 A1 | 10/2008 | Chiang et al. |
| 2009/0014320 A1 | 1/2009 | Chiang et al. |
| 2009/0034051 A1 | 2/2009 | Arsenault et al. |
| 2009/0296188 A1 | 12/2009 | Jain et al. |
| 2010/0075056 A1 | 3/2010 | Axisa et al. |
| 2011/0042204 A1 | 2/2011 | Chiang et al. |
| 2011/0149410 A1 | 6/2011 | Blum |
| 2011/0242638 A1 | 10/2011 | Horning et al. |
| 2011/0275996 A1 | 11/2011 | Gyory et al. |
| 2012/0019185 A1 | 1/2012 | Guidarelli et al. |
| 2012/0029416 A1 | 2/2012 | Parker et al. |
| 2012/0200931 A1 | 8/2012 | Haag et al. |
| 2012/0211261 A1 | 8/2012 | Aabloo et al. |
| 2012/0298200 A1 | 11/2012 | Niggemann et al. |
| 2013/0176628 A1 | 7/2013 | Batchko et al. |
| 2013/0202867 A1 | 8/2013 | Coggio et al. |
| 2013/0222881 A1 | 8/2013 | Aizenberg et al. |
| 2013/0279151 A1 | 10/2013 | Ouderkirk et al. |
| 2013/0335807 A1 | 12/2013 | Arsenault et al. |
| 2014/0133010 A1 | 5/2014 | Han et al. |
| 2014/0204372 A1 | 7/2014 | Pang et al. |
| 2014/0217539 A1 | 8/2014 | Rantala |
| 2014/0234995 A1 | 8/2014 | Li et al. |
| 2014/0266647 A1 | 9/2014 | Visitacion et al. |
| 2014/0294345 A1* | 10/2014 | Kopp .................. G02B 6/30 385/24 |
| 2014/0312737 A1 | 10/2014 | Jenninger et al. |
| 2014/0323603 A1 | 10/2014 | Kolb et al. |
| 2014/0326292 A1 | 11/2014 | Yordem et al. |
| 2014/0350528 A1 | 11/2014 | Chiang et al. |
| 2015/0109657 A1 | 4/2015 | Baumberg et al. |
| 2015/0205126 A1 | 7/2015 | Schowengerdt |
| 2015/0241698 A1 | 8/2015 | Schowengerdt |
| 2015/0259493 A1 | 9/2015 | Nederkoorn et al. |
| 2015/0315012 A1 | 11/2015 | Wiersma et al. |
| 2016/0036353 A1 | 2/2016 | Stasik et al. |
| 2016/0103341 A1 | 4/2016 | Long et al. |
| 2016/0187985 A1 | 6/2016 | Lim et al. |
| 2016/0283773 A1 | 9/2016 | Popovich et al. |
| 2017/0023807 A1 | 1/2017 | Chang-Hasnain et al. |
| 2017/0031078 A1 | 2/2017 | Thompson et al. |
| 2017/0090570 A1 | 3/2017 | Rain et al. |
| 2017/0192595 A1 | 7/2017 | Choi et al. |
| 2017/0285348 A1 | 10/2017 | Ayres et al. |
| 2017/0365630 A1 | 12/2017 | Yang |
| 2018/0093456 A1 | 4/2018 | Van Overmeere et al. |
| 2018/0164627 A1 | 6/2018 | Oh |
| 2018/0175746 A1 | 6/2018 | Van Den Ende et al. |
| 2018/0356303 A1 | 12/2018 | Li et al. |
| 2019/0296218 A1 | 9/2019 | Ouderkirk et al. |
| 2019/0361318 A1 | 11/2019 | Johnson et al. |
| 2020/0076328 A1 | 3/2020 | Cha et al. |
| 2020/0183168 A1 | 6/2020 | Spann et al. |
| 2020/0183199 A1 | 6/2020 | Diest et al. |
| 2020/0183200 A1 | 6/2020 | Diest et al. |
| 2020/0185590 A1 | 6/2020 | Malhotra et al. |
| 2022/0199894 A1 | 6/2022 | Park et al. |

FOREIGN PATENT DOCUMENTS

| | | |
|---|---|---|
| CN | 101672949 A | 3/2010 |
| CN | 102712140 A | 10/2012 |
| CN | 102713702 A | 10/2012 |
| CN | 103168259 A | 6/2013 |
| CN | 103502855 A | 1/2014 |
| EP | 0807459 A1 | 11/1997 |
| KR | 20080091455 A | 10/2008 |
| KR | 102396790 B1 | 5/2022 |
| WO | 02063073 A1 | 8/2002 |
| WO | 2005062396 A1 | 7/2005 |
| WO | 2008094196 A2 | 8/2008 |
| WO | 2011088161 A1 | 7/2011 |
| WO | 2012083174 A2 | 6/2012 |
| WO | 2012116199 A1 | 8/2012 |
| WO | 2014069477 A1 | 5/2014 |
| WO | 2015023803 A1 | 2/2015 |
| WO | 2018000744 A1 | 1/2018 |

OTHER PUBLICATIONS

Office Action dated Oct. 11, 2022 for Chinese Application No. 201980082159.3, filed Jun. 11, 2021, 12 pages.

Office Action dated Oct. 11, 2022 for Chinese Application No. 201980082380.9, filed Jun. 11, 2021, 17 pages.

Office Action dated Jun. 1, 2023 for European Patent Application No. 19828066.1, filed on Dec. 4, 2019, 7 pages.

Meier W., et al., "Microemulsion Elastomers," Colloid and Polymer Science, Mar. 1, 1996, vol. 274, pp. 218-226.

(56) References Cited

OTHER PUBLICATIONS

Merkel T.C., et al., "Gas Sorption, Diffusion, and Permeation in Poly(Dimethylsiloxane)," Journal of Polymer Science: Part B: Polymer Physics, Feb. 1, 2000, vol. 38, pp. 415-434.
Michler G.H., et al., "The Physics and Micro-Mechanics of Nano-Voids and Nano-Particles in Polymer Combinations," ScienceDirect, Polymer, Jun. 7, 2013, vol. 54 (13), pp. 3131-3144.
Moore D.T., "Chapter 9: Gradient Index Optics," Optical Elements, IVPV Handbook of Optics, 2nd Edition, vol. II—Devices, Measurements, and Properties, 1995, pp. 9.1-9.10.
Mullin T., et al., "Pattern Transformation Triggered by Deformation," Physical Review Letters, Aug. 22, 2007, vol. 99 (8), Article No. 084301, 4 pages.
Nguyen B.N., et al., "Synthesis, Processing, and Characterization of Inorganic-Organic Hybrid Cross-Linked Silica, Organic Polyimide, and Inorganic Aluminosilicate Aerogels," National Aeronautics and Space Administration STI Program, Jul. 2014, 58 pages.
Non-Final Office Action dated Oct. 19, 2020 for U.S. Appl. No. 16/364,977, filed Mar. 26, 2019, 38 Pages.
Non-Final Office Action dated Jun. 23, 2020 for U.S. Appl. No. 16/351,477, filed Mar. 12, 2019, 27 Pages.
Non-Final Office Action dated Nov. 24, 2020 for U.S. Appl. No. 16/449,964, filed Jun. 24, 2019, 91 Pages.
Notice of Allowance dated Feb. 2, 2021 for U.S. Appl. No. 16/364,977, filed Mar. 26, 2019, 40 Pages.
Notice of Allowance dated Jun. 3, 2021 for U.S. Appl. No. 16/703,291, filed Dec. 4, 2019, 61 Pages.
Notice of Allowance dated Feb. 4, 2021 for U.S. Appl. No. 16/263,829, filed Jan. 31, 2019, 27 Pages.
Notice of Allowance dated Mar. 4, 2021 for U.S. Appl. No. 16/449,964, filed Jun. 24, 2019, 21 Pages.
Notice of Allowance dated Apr. 6, 2021 for U.S. Appl. No. 16/262,439, filed Jan. 30, 2019, 38 Pages.
Notice of Allowance dated Mar. 29, 2021 for U.S. Appl. No. 16/351,477, filed Mar. 12, 2019, 28 Pages.
Ouderkirk A.J., et al., "Nanovoided Graded-Index Optical Elements, Optical Arrays, and Methods of Forming the Same," U.S. Appl. No. 16/426,737, filed May 30, 2019, 113 pages.
Ouderkirk A.J., et al., "Waveguide With Switchable Input," U.S. Appl. No. 16/263,829, filed Jan. 31, 2019, 55 pages.
Overvelde J.T.B., et al., "Relating Pore Shape to the Non-Linear Response of Periodic Elastomeric Structures," Journal of the Mechanics and Physics of Solids, Mar. 2014, vol. 64, 16 pages.
Plante J-S., et al., "Large-Scale Failure Modes of Dielectric Elastomer Actuators," International Journal of Solids and Structures, Dec. 2006, vol. 43, Issue 25-26, pp. 7727-7751.
Pre-Interview First Office Action dated Dec. 22, 2020 for U.S. Appl. No. 16/263,829, filed Jan. 31, 2019, 36 pages.
Pre-Interview First Office Action dated Oct. 26, 2020 for U.S. Appl. No. 16/262,433, filed Jan. 30, 2019, 68 pages.
Pre-Interview First Office Action dated Nov. 30, 2020 for U.S. Appl. No. 16/262,439, filed Jan. 30, 2019, 42 Pages.
"Product: EMP Haptic Actuators For Sensory Innovation," Novasentis [online], Retrieved on Mar. 9, 2019, 4 pages, Retrieved from the Internet: URL: https://www.novasentis.com/product.
Rao V.A., et al., "Synthesis of Flexible Silica Aerogels Using Methyltrimethoxysilane (MTMS) Precursor," Journal of Colloid and Interface Science, Aug. 1, 2006, vol. 300 (1), pp. 279-285.
Ren X., et al., "Design and Characterisation of a Tuneable 3D Buckling-Induced Auxetic Metamaterial," Materials and Design, Feb. 5, 2018, vol. 139, pp. 336-342.
Richter I., et al., "Design Considerations of Form Birefringent Microstructures," Applied Optics, May 10, 1995, vol. 34 (14), pp. 2421-2429.
Rogers J.A., et al., "Materials and Mechanics for Stretchable Electronics," Science, Mar. 26, 2010, vol. 327, pp. 1603-1607.
Rosset S., et al., "Small, Fast, and Tough: Shrinking Down Integrated Elastomer Transducers," Applied Physics Reviews, Sep. 26, 2016, vol. 3 (3), Article 031105, pp. 1-20.
Rosset S., et al., "Mechanical Characterization of a Dielectric Elastomer Microactuator with Ion-implanted Electrodes," Sensors and Actuators A: Physical, May 28, 2008, vol. 144 (1), pp. 185-193.
Sekitani T., et al., "Stretchable Active-Matrix Organic Light-Emitting Diode Display Using Printable Elastic Conductors," Nature Materials, Jun. 2009, vol. 8, pp. 494-499.
Seo M., et al., "Reticulated Nanoporous Polymers by Controlled Polymerization-Induced Microphase Separation," Science, Jun. 15, 2012, vol. 336, 5 pages.
Sharma R., et al., "Switchable Electroactive Devices for Head-Mounted Displays," U.S. Appl. No. 16/351,477, filed Mar. 12, 2019, 108 pages.
Shatz N., "Gradient-Index Optics," Science Applications International Corporation, Final Report, Mar. 31, 2010, 103 pages.
Shen J., et al., "Simple Cubic Three-Dimensional Auxetic Metamaterials," Physica Status Solidi (B), Jul. 17, 2014, vol. 251 (8), pp. 1515-1522.
Shir D.J-L., et al., "Three-Dimensional Nanofabrication with Elastomeric Phase Mask," PhD Thesis, University of Illinois at Urbana-Champaign, 2010, 138 pages.
Si G., et al., "Liquid-Crystal-Enabled Active Plasmonics: A Review," Materials, Feb. 18, 2014, vol. 7 (2), pp. 1296-1317, XP055673383.
Skov A.L., et al., "Optimization Techniques for Improving the Performance of Silicone-Based Dielectric Elastomers," Advanced Engineering Materials, 2018, vol. 20 (5), Article 1700762, pp. 1-21.
Solans C., et al., "Nano-Emulsions: Formation by Low-Energy Methods," Current Opinion in Colloid & Interface Science, Oct. 2012, vol. 17 (5), pp. 246-254.
Sole I., et al., "Nano-Emulsions Prepared by the Phase Inversion Composition Method: Preparation Variables and Scale Up," Journal of Colloid and Interface Science, ScienceDirect, Apr. 15, 2010, vol. 344 (2), pp. 417-423.
Someya T., et al., "Conformable, Flexible, Large-Area Networks of Pressure and Thermal Sensors with Organic Transistor Active Matrixes," Proceedings of the National Academy of Sciences of the United States of America, Aug. 30, 2005, vol. 102 (35), pp. 12321-12325, Retrieved from the Internet: URL: www.pnas.org/cgi/doi/10.1073/pnas.0502392102.
Spann A., "Nanovoided Polymers Having Shaped Voids," U.S. Appl. No. 16/703,674, filed Dec. 4, 2019, 149 pages.
Spann A., "Reduced Hysteresis and Reduced Creep in Nanovoided Polymer Devices," U.S. Appl. No. 16/703,291, filed Dec. 4, 2019, 152 pages.
Struzynska-Piron I., et al., "Synthesis of Solvent Stable Polymeric Membranes Via UV Depth-Curing," Chemical Communications, 2013, vol. 49, Article 11494, pp. 11494-11496.
Sultan B., et al., "Electrical Breakdown Testing of Materials Intended for Use in PV Modules," 3rd Atlas/NIST Workshop on Photovoltaics, Materials Durability, Gaitherburg, Maryland, Dec. 8-9, 2015, 29 pages.
Tanaka T., et al., "Polymer Nanocomposites as Dielectrics and Electrical Insulation-perspectives for Processing Technologies, Material Characterization and Future Applications," IEEE Transactions on Dielectrics and Electrical Insulation, Oct. 2004, vol. 11 (5), pp. 763-784.
Tanaka T., et al., "Proposal of a Multi-Core Model for Polymer Nanocomposite Dielectrics," IEEE Transactions on Dielectrics and Electrical Insulation, vol. 12 (4), Aug. 2005, pp. 669-681.
Teichman J., et al., "Gradient Index Optics at DARPA," Institute for Defense Analyses, IDA Document D-5027, Nov. 2013, 69 pages.
Waldern J.D., et al., "DigiLens Switchable Bragg Grating Waveguide Optics for Augmented Reality Applications," Proceedings of SPIE, Digital Optics for Immersive Displays, May 21, 2018, vol. 10676, pp. 106760G-1-106760G-16.
Wegener M., et al., "Controlled Inflation of Voids in Cellular Polymer Ferroelectrets: Optimizing Electromechanical Transducer Properties," Applied Physics Letters, Jan. 19, 2004, vol. 84 (3), pp. 392-394.
Wilson B.K., et al., "Variable Wave Plate via Tunable Form-Birefringent Structures," Journal of Microelectromechanical Systems, Aug. 2008, vol. 17 (4), pp. 1039-1046.

(56) References Cited

OTHER PUBLICATIONS

Wolak M.A., et al., "Dielectric Response of Structured Multilayered Polymer Films Fabricated by Forced Assembly," Applied Physics Letters, Mar. 17, 2008, vol. 92, Article 113301, pp. 1-3.
Wu A.S., et al., "3D Printed Silicones With Shape Memory," Scientific Reports, Jul. 5, 2017, vol. 7, Article 4664, pp. 1-6.
Wu J., et al., "Efficient Multi-Barrier Thin Film Encapsulation of OLED Using Alternating Al2O3 and Polymer Layers," RSC Advances, Feb. 2, 2018, vol. 8, pp. 5721-5727.
Wu X., et al., "Fabrication of Ultralong Perovskite Structure Nanotubes," RSC Advances, Jan. 2, 2018, vol. 8, pp. 367-373.
Yang S., et al., "Avoiding the Pull-in Instability of a Dielectric Elastomer Film and the Potential for Increased Actuation and Energy Harvesting," Royal Society of Chemistry, Soft Matter, Jan. 6, 2017, vol. 13, pp. 4552-4558.
Yang S., et al., "Harnessing Surface Wrinkle Patterns in Soft Matter," Advanced Functional Materials, Jul. 29, 2010, vol. 20, pp. 2550-2564.
Zhang C., et al., "Highly Porous Polyhedral Silsesquioxane Polymers. Synthesis and Characterization," Journal of the American Chemical Society, Aug. 11, 1998, vol. 120 (33), pp. 8380-8391.
Zhu J., et al., "Large Deformation and Electromechanical Instability of a Dielectric Elastomer Tube Actuator," Journal of Applied Physics, Oct. 13, 2010, vol. 108 (7), Article 074113, pp. 1-6.
Zuev Y.S., "Elastomer-Gas Systems," International Polymer Science and Technology, Feb. 1, 2001, vol. 28 (2), pp. 43-53.
Babaee S., et al., "3D Soft Metamaterials with Negative Poisson's Ratio," Advanced Materials, Sep. 25, 2013, vol. 25 (36), 18 pages.
Bertoldi K., et al., "Novel Negative Poisson's Ratio Behavior Induced by an Elastic Instability," Advanced Materials, Jan. 13, 2010, vol. 22 (3), 11 pages.
Bickel B., et al., "Design and Fabrication of Materials with Desired Deformation Behavior," ACM Transactions on Graphics, Publication date: Jul. 2010, vol. 29 (4), Article 63, 10 pages.
Cameron C.G., et al., "Linear Actuation in Coextruded Dielectric Elastomer Tubes," Sensors and Actuators A: Physical, ScienceDirect, Sep. 15, 2008, vol. 147 (1), pp. 286-291.
Camino G., et al., "Polydimethylsiloxane Thermal Degradation Part 1. Kinetic Aspects," Polymer, 2001, vol. 42, pp. 2395-2402.
Catmull E., et al., "Recursively Generated B-Spline Surfaces on Arbitrary Topological Meshes," Computer-Aided Design, Nov. 1, 1978, vol. 10 (6), pp. 183-188.
Cheng Y-J., et al., "Controlled In Situ Nanocavitation in Polymeric Materials," Advanced Materials, Jan. 18, 2011, vol. 23 (3), pp. 409-413.
Correa D.M., et al., "Negative Stiffness Honeycombs for Recoverable Shock Isolation," Rapid Prototyping Journal, Mar. 16, 2015, vol. 21 (2), pp. 193-200, Retrieved from the Internet: URL: www.emeraldinsight.com/1355-2546.htm.
Correa D.M., et al., "Negative Stiffness Honeycombs for Recoverable Shock Isolation," Rapid Prototyping Journal, 2015, vol. 21 (2), pp. 702-713.
Coulais C., et al., "Discontinuous Buckling of Wide Beams and Metabeams," Physical Review Letters, Jul. 24, 2015, vol. 115 (4), 7 pages.
Crawford G.P., "Electrically Switchable Bragg Gratings," Optics & Photonics News, Apr. 2003, vol. 14 (4), pp. 54-59.
Cruz-Hernandez J.M., et al., "Phase Control Approach to Hysteresis Reduction," IEEE Transactions on Control Systems Technology, Jan. 1, 2001, vol. 9 (1), pp. 17-26.
Dickson W., et al., "Electronically Controlled Surface Plasmon Dispersion and Optical Transmission Through Metallic Hole Arrays Using Liquid Crystal," Nano Letters, Jan. 1, 2008, vol. 8 (1), pp. 281-286, XP055673425.
Diest K., et al., "Nanovoided Tunable Birefringence," U.S. Appl. No. 16/262,433, filed Jan. 30, 2019, 51 pages.
Diest K., et al., "Nanovoided Tunable Optics," U.S. Appl. No. 16/262,439, filed Jan. 30, 2019, 57 pages.
Diest K., et al., "Polymer Materials Including Coated Nanovoids and Methods and Systems for Forming the Same," U.S. Appl. No. 16/512,335, filed Jul. 15, 2019, 133 pages.
"Electroactive Polymers," Optotune [online], Retrieved on Mar. 10, 2019, 3 pages, Retrieved from the Internet: URL: https://www.optotune.com/technology/electroactive-polymers.
Final Office Action dated Dec. 1, 2020 for U.S. Appl. No. 16/351,477, filed Mar. 12, 2019, 38 Pages.
Final Office Action dated May 25, 2021 for U.S. Appl. No. 16/262,433, filed Jan. 30, 2019, 30 Pages.
First Office Action Interview dated Mar. 1, 2021 for U.S. Appl. No. 16/262,433, filed Jan. 30, 2019, 12 Pages.
Fratzl P., et al., "The Mechanics of Tessellations—Bioinspired Strategies for Fracture Resistance," Chemical Society Reviews, Jan. 21, 2016, vol. 45 (2), pp. 252-267.
Fuse N., et al., "Possible Mechanism of Superior Partial-Discharge Resistance of Polyamide Nanocomposites," IEEE Annual Report Conference on Electrical Insulation and Dielectric Phenomena, 2004, pp. 322-325.
Gerratt A.P., et al., "Dielectric Breakdown of PDMS Thin Films," Journal of Micromechanics and Microengineering, Technical Note, Published on Apr. 26, 2013, vol. 23 (6), pp. 1-7.
Gohtani S., et al., "Nano-Emulsions; Emulsification Using Low Energy Methods," Japan Journal of Food Engineering, Sep. 2014, vol. 15 (3), pp. 119-130.
Guha I.F., et al., "Creating Nanoscale Emulsions Using Condensation," Nature Communications, Published: Nov. 8, 2017, vol. 8, Article 1371, pp. 1-7.
Gupta A., et al., "Nanoemulsions: Formation, Properties and Applications," Soft Matter, Published: Feb. 23, 2016, vol. 12 (11), 16 pages.
Helgeson M.E., et al., "Mesoporous Organohydrogels from Thermogelling Photocrosslinkable Nanoemulsions," Nature Materials, Published: Feb. 12, 2012, vol. 11, pp. 344-352.
Holda A.K., et al., "Understanding and Guiding the Phase Inversion Process for Synthesis of Solvent Resistant Nanofiltration Membranes," Journal of Applied Polymer Science, Published: Mar. 26, 2015, vol. 132 (27), Article 42130, pp. 1-17.
Hunt S., et al., "A Self-Healing Dielectric Elastomer Actuator," Applied Physics Letters, Published: Mar. 19, 2014, vol. 104, Article 113701, 4 pages.
Ieda M., "Dielectric Breakdown Process of Polymers," IEEE Transactions on Electrical Insulation, Jun. 1980, vol. EI-15 (3), pp. 206-224.
International Preliminary Report on Patentability for International Application No. PCT/US2019/064367, dated Jun. 24, 2021, 10 Pages.
International Preliminary Report on Patentability for International Application No. PCT/US2019/064395, dated Jun. 24, 2021, 10 Pages.
International Search Report and Written Opinion for International Application No. PCT/US2019/064367, dated Mar. 11, 2020, 12 Pages.
International Search Report and Written Opinion for International Application No. PCT/US2019/064395, dated Mar. 12, 2020, 12 Pages.
Jang J-H., et al., "Mechanically Tunable Three-Dimensional Elastomeric Network/Air Structures via Interference lithography," Nano Letters, Mar. 15, 2006, vol. 6 (4), pp. 740-743.
Jennings S.G., "The Mean Free Path in Air," Journal of Aerosol Science, Apr. 1988, vol. 19 (2), 2 pages.
Jeon S., et al., "Three Dimensional Nanoporous Density Graded Materials Formed by Optical Exposures Through Conformable Phase Masks," Applied Physics Letters, Dec. 18, 2006, vol. 89, Article 253101, 3 pages.
Johnson R.W., et al., "A Brief Review of Atomic Layer Deposition: From Fundamentals to Applications," Materials Today, Jun. 2014, vol. 17 (5), pp. 236-246.
Kim M-C., et al., "Mathematical Analysis of Oxygen Transfer Through Polydimethylsiloxane Membrane Between Double Layers of Cell Culture Channel and Gas Chamber in Microfluidic Oxygenator," Microfluidics and Nanofluidics, Feb. 1, 2013, vol. 15 (3), 39 pages.

(56) References Cited

OTHER PUBLICATIONS

Landig R.E.K., et al., "Fabrication of Shaped Voids," U.S. Appl. No. 16/669,970, filed Oct. 31, 2019, 110 pages.
Landig R.E.K., et al., "Multiple Layers Between Electrodes Including Nanovoided Polymer," U.S. Appl. No. 16/386,232, filed Apr. 16, 2019, 126 pages.
Landig R.E.K., et al., "Nanovoided Polymers Using Phase Inversion," U.S. Appl. No. 16/449,964, filed Jun. 24, 2019, 139 pages.
Landig R.E.K., et al., "Planarization Layers for Nanovoided Polymers," U.S. Appl. No. 16/364,977, filed Mar. 26, 2019, 125 pages.
Loiko V.A., et al., "Experimental Results and Theoretical Model to Describe Angular Dependence of Light Scattering by Monolayer of Nematic Droplets," Journal of Quantitative Spectroscopy and Radiative Transfer, Jul. 2016, vol. 178, 11 pages.
Loop C.T., "Smooth Subdivision Surfaces Based on Triangles," Thesis, Master of Science, Department of Mathematics, The University of Utah, Aug. 1, 1987, 74 pages.
MacKey M., et al., "Enhanced Breakdown Strength of Multilayered Films Fabricated by Forced Assembly Microlayer Coextrusion," Journal of Physics D: Applied Physics, Published on: Aug. 12, 2009, vol. 42 (17), Article 175304, pp. 11-12.
Mahadik D.B., et al., "Elastic and Superhydrophobic Monolithic Methyltrimethoxysilane-Based Silica Aerogels by Two-Step Sol-Gel Process," Journal of the Microelectronics and Packaging Society, Mar. 30, 2016, vol. 23 (1), pp. 35-39.
Malhotra T., et al., "Spatially Addressable Nanovoided Polymers," U.S. Appl. No. 16/417,911, filed May 21, 2019, 138 pages.
Matyka M., et al., "How to Calculate Tortuosity Easily," AIP Conference Proceedings, Mar. 26, 2012, 6 pages.
Mazurek P.S., et al., "Glycerol as High-Permittivity Liquid Filler in Dielectric Silicone Elastomers," Journal of Applied Polymer Science, Jul. 2016, vol. 133 (43), 28 pages.

\* cited by examiner

NANOVOIDED GRADED-INDEX OPTICAL ELEMENTS, OPTICAL ARRAYS, AND METHODS OF FORMING THE SAME

CROSS-REFERENCE TO RELATED APPLICATIONS

This application is a divisional of U.S. patent application Ser. No. 16/426,737 filed 30 May 2019, which claims the benefit of U.S. Provisional Application No. 62/777,825, filed 11 Dec. 2018, the disclosure of each of is incorporated, in their entirety, by this reference.

BACKGROUND

Virtual-reality and augmented-reality eyewear devices or headsets may enable users to experience events, such as interactions with people in a computer-generated simulation of a three-dimensional world or viewing data superimposed on a real-world view. Such eyewear devices and headsets may also be used for purposes other than recreation. For example, governments may use such devices for military training, medical professionals may use such devices to simulate surgery, and engineers may use such devices as design visualization aids.

Conventional lensed arrays used in virtual-reality and augmented-reality devices may include an array of refractive lenses. These refractive lenses may be formed by, for example, a thermal reflow process, a glass or plastic molding process, and/or a process of molding and curing resin. Enclosed air spaces are typically formed around the refractive lenses to increase the differences in refractive indices between the lenses and their ambient environment. These air spaces are often problematic since they must commonly be sealed to protect the lenses from contamination, condensation, and intrusion of materials that can reduce the performance of the lenses. Thus, there is a need for lens systems that reduce the spatial requirements for lensed arrays and/or minimize or eliminate the need for air spaces to achieve sufficient degrees of refraction.

Furthermore, lenses are commonly limited in the degree of refraction that can be created to, for example, focus light from one point to another within a short distance. Such short-range focusing may be commonly achieved by using a series of two or more separate lenses, which may disadvantageously add to the complexity, spatial requirements, and cost of fabricating suitable optical devices. Some conventional gradient-index lenses (e.g., GRIN-rod lenses) may provide a lens system that avoids the necessity of using multiple lenses to suitably focus light from one point to another. However, such GRIN-rod lenses are typically limited in dynamic range and corresponding optical power. As such, there is a need for simpler lens structures that are capable of delivering suitable optical characteristics, including improved dynamic range and optical power.

SUMMARY

As will be described in greater detail below, the instant disclosure relates to optical elements and methods of manufacturing optical elements that include nanovoided polymer materials. In some embodiments, a graded-index optical element may include a nanovoided material having a first surface and a second surface opposite the first surface. The nanovoided material may be transparent between the first surface and the second surface, and the nanovoided material may have a predefined change in effective refractive index in at least one axis due to a change in at least one of nanovoid size or nanovoid distribution along the at least one axis.

In at least one embodiment, the effective refractive index may change along two orthogonal axes. An optical axis of the graded-index optical element may pass through each of the first surface and the second surface. In various examples, the first surface may be substantially parallel to the second surface. Additionally or alternatively, the first surface and the second surface may each be substantially planar.

In some embodiments, the nanovoided material may include an elastomeric material. In additional embodiments, the nanovoided material may include a substantially inelastic material such that the nanovoided material substantially retains a desired shape. The gradient-index optical element may be at least one of a lens or a prism.

A corresponding optical array may include a plurality of graded-index optical elements each including a nanovoided material having a first surface and a second surface opposite the first surface. The nanovoided material may (1) be transparent between the first surface and the second surface, and (2) have a predefined change in effective refractive index in at least one axis due to a change in at least one of nanovoid size or nanovoid distribution along the at least one axis.

According to at least one embodiment, each of the plurality of graded-index optical elements may be disposed on a surface of a transparent support substrate. The first surfaces of the plurality of graded-index optical elements may face the transparent support substrate and the second surfaces of the plurality of graded-index optical elements may be substantially parallel.

In some embodiments, the optical array may further include a transparent protective material disposed on a side of each of the plurality of graded-index optical elements opposite the transparent support substrate. At least one of the first surface or the second surface of each of the plurality of graded-index optical elements may be substantially planar. In various examples, each of the plurality of gradient-index optical elements may include at least one of a lens or a prism.

A method for manufacturing a graded-index optical element may include (1) forming a nanovoided material having an initial optical element shape, wherein the nanovoided polymer material is transparent, and (2) compressing the nanovoided material into a compressed optical element shape having at least one surface that differs in surface shape from a corresponding surface of the initial optical element shape. The nanovoided material of the compressed optical element may have a predefined change in effective refractive index in at least one axis due to a change in at least one of nanovoid size or nanovoid distribution along the at least one axis. The nanovoided material may have a change in density in the at least one axis corresponding to the change in nanovoid size and/or nanovoid distribution, with the nanovoids occupying a varying volume fraction of the nanovoided material along the at least one axis.

In at least one embodiment, forming the nanovoided material may include (1) preparing a mixture including a curable material and a solvent, (2) processing the mixture to form a cured polymer material including at least one non-polymeric component in a plurality of defined regions, and (3) removing at least a portion of the at least one non-polymeric component from the cured polymer material to form the nanovoided polymer material having the initial optical element shape. In some examples, preparing the mixture including the curable material and the solvent may include disposing the mixture on a transparent support substrate.

In various embodiments, the initial optical element shape may be a lenticular, aspheric, anamorphic, or prism shape. In at least one example, the compressed optical element shape may have a first surface and a second surface opposite the first surface. At least one of the first surface or the second surface of the compressed optical element shape may be substantially planar. In some examples, an average thickness between the first surface and the second surface of the compressed optical element shape may be less than an average thickness between two surfaces of the initial optical element shape corresponding to the first surface and the second surface.

Features from any of the these or other embodiments disclosed herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
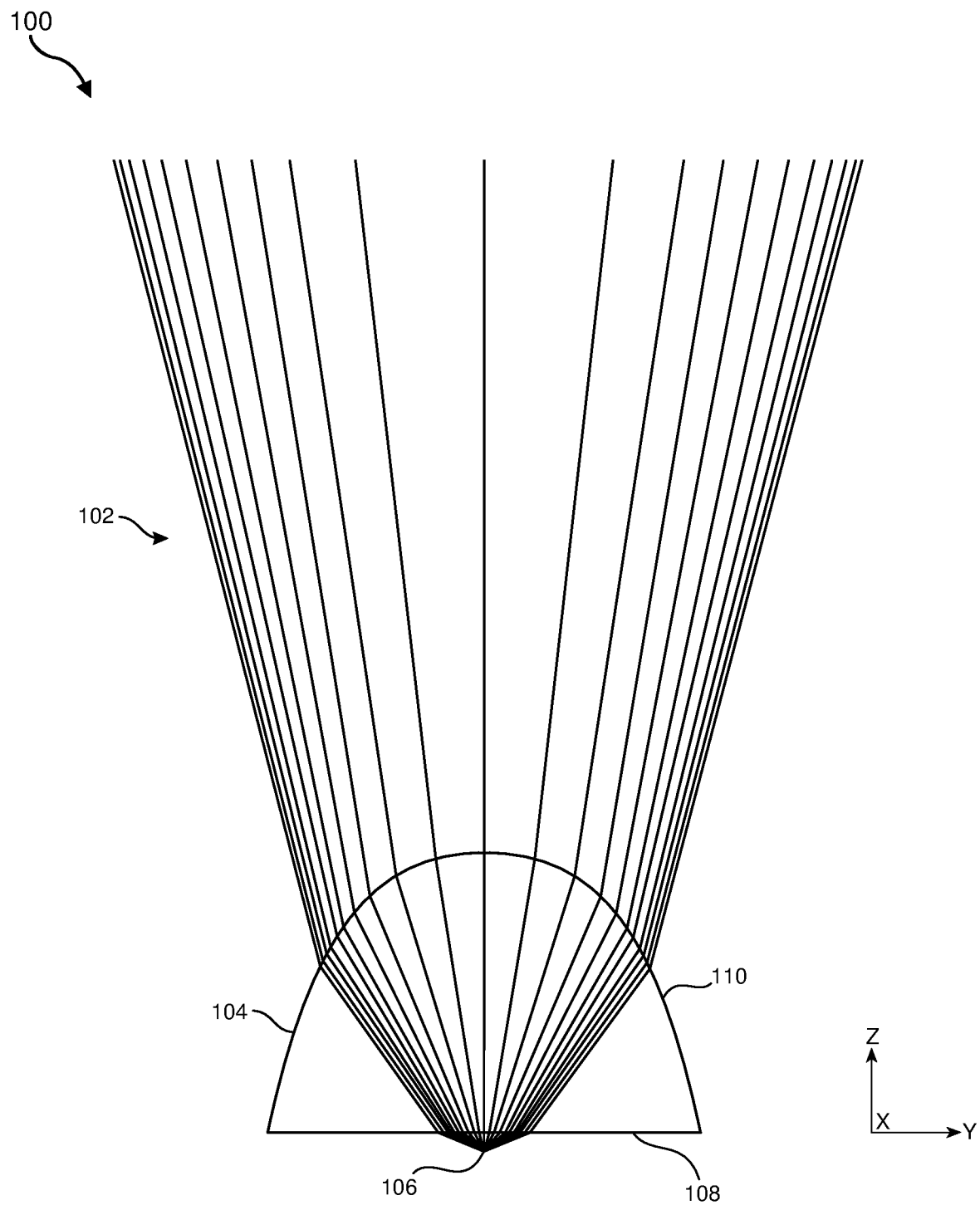
FIG. 1A is an illustration of an example optical system including an example lens element refracting incident light in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to optical components, including graded-index (GRIN) lenses, that include optically transparent nanovoided materials. As used herein, an "optical element" may include a structured or unstructured article configured to interact with light, and may include, without limitation, refractive optics, reflective optics, dispersive optics, polarization optics, or diffractive optics. Rather than primarily relying on the shape of a material to refract light in a desired manner, as is the case with traditional optical elements including conventional lenses and prisms, the disclosed GRIN optical elements may utilize an effective refractive index gradient of a nanovoided material to focus, collimate, and/or otherwise redirect light. In contrast to traditional optical materials that may have a homogeneous index of refraction, nanovoided materials represent a class of optical materials in which the index of refraction may be selectively tuned within a range of values in different regions of a material volume to advantageously control the interaction of the nanovoided materials with light.

GRIN optical elements disclosed herein may have more compact shapes than conventional optical elements, and in many cases, may have flat surfaces in place of curved and/or sloped optical surfaces. Effective refractive indices of the GRIN optical elements may vary along index gradients that are highly customizable with a substantial degree of precision, allowing for the production optical elements that are substantially free of optical aberrations common to many conventional optical elements. In some embodiments, GRIN optical elements may exhibit optical properties that are difficult to obtain without more complex multi-lens systems.

As described herein, GRIN optical elements may have refractive indices that vary in accordance with variations in nanovoid attributes and/or bulk matrix properties of a nanovoided material. For example, the gradient of the effective refractive index of the material may vary in accordance with differing nanovoid distributions, shapes, and/or sizes. In some examples, nanovoids may be selectively formed and/or dispersed within a bulk matrix material to obtain a desired effective refractive index gradient along at least one axis. For example, as will be described herein, a nanovoided material may be formed and subsequently shaped to selectively compress regions of the nanovoided material so as to obtain desired optical characteristics. In some embodiments, GRIN optical elements, such as GRIN lenses, formed in this manner may be utilized in arrays that are improved in functionality and durability and which do not require air gaps or other space-consuming features to protect the GRIN optical elements and/or to enhance optical performance characteristics.

Figure 14:
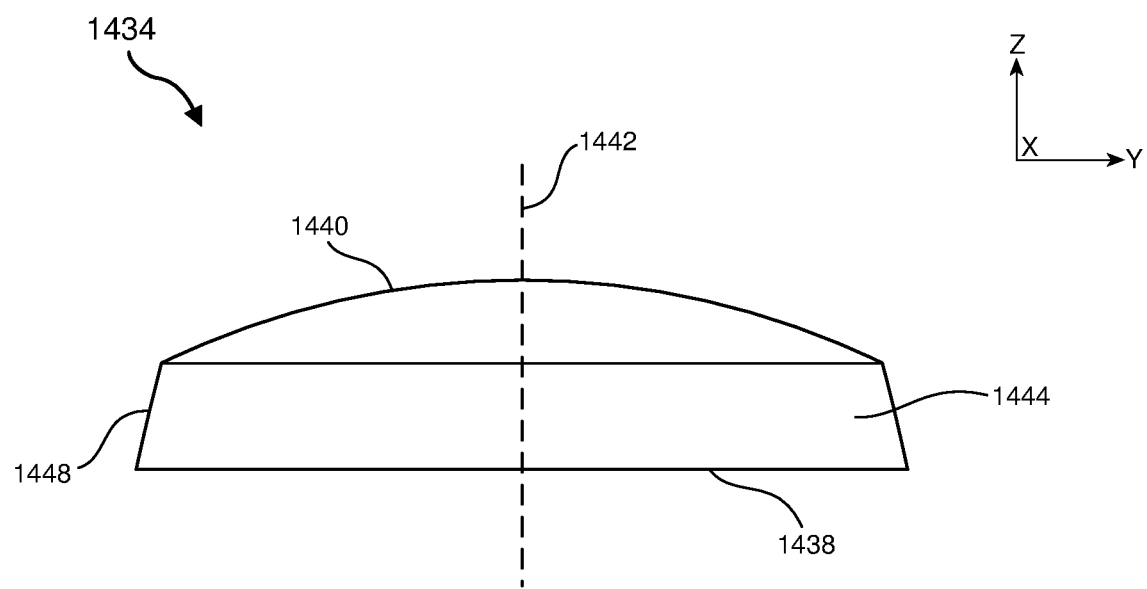
FIG. 14 is an illustration of an example GRIN lens in accordance with some embodiments.
Figure 15:
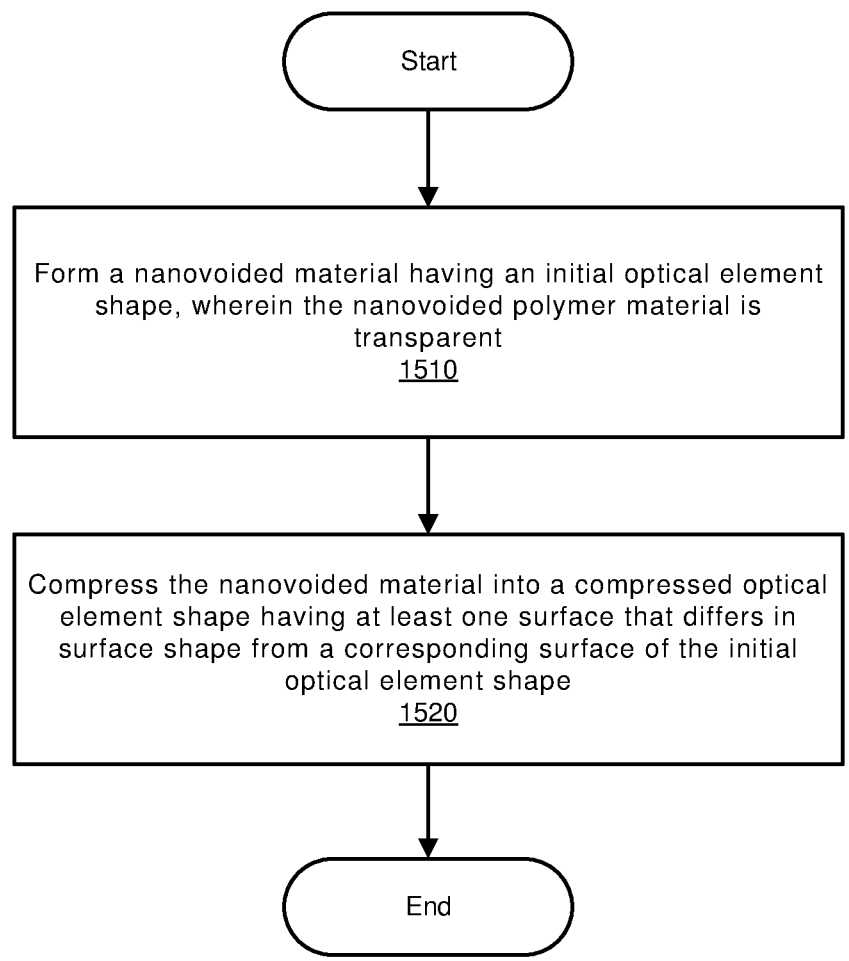
FIG. 15 is a flow diagram of an example method for forming GRIN lenses according to some embodiments.
Figure 16:
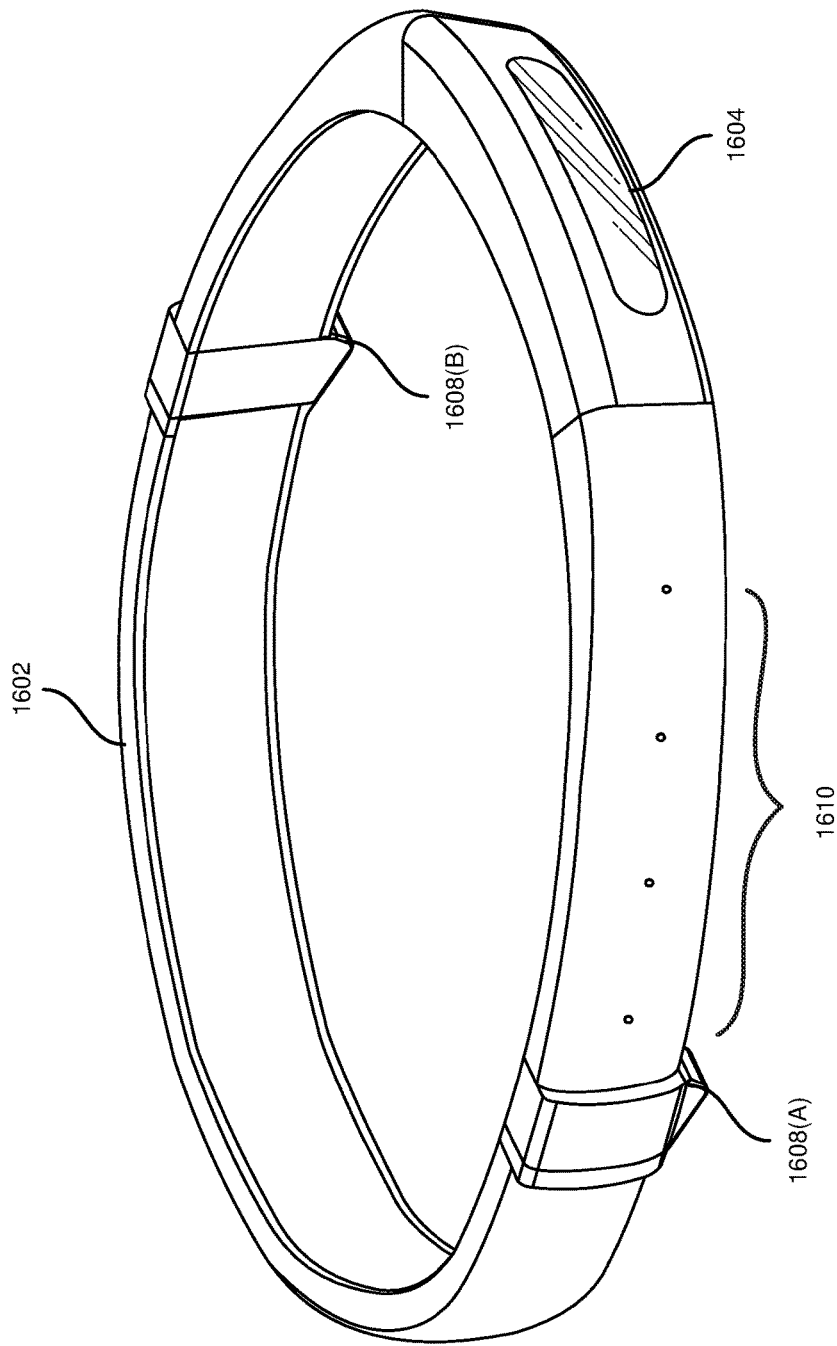
FIG. 16 is an illustration of an example artificial-reality headband that may be used in connection with embodiments of this disclosure.
Figure 17:
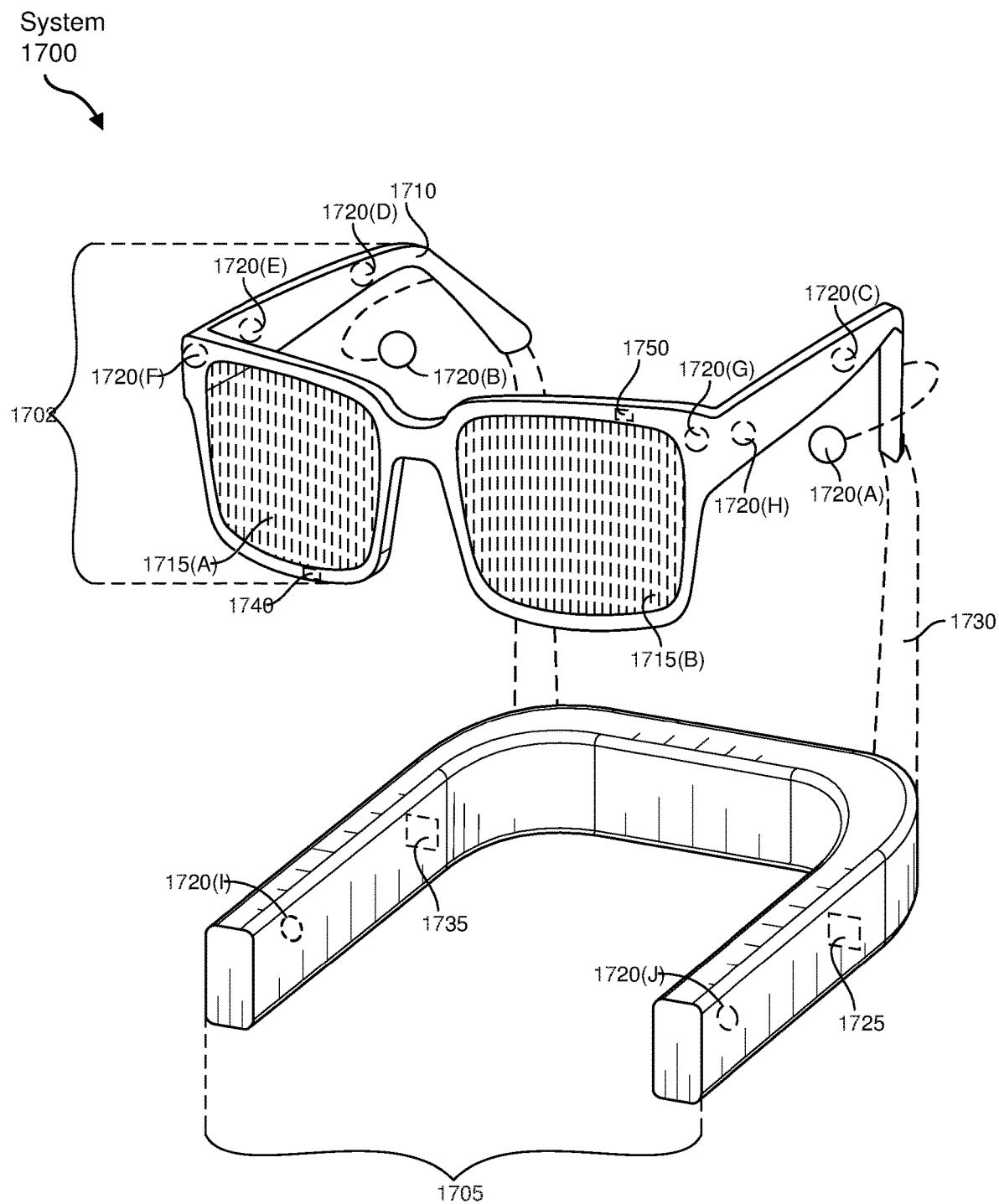
FIG. 17 is an illustration of example augmented-reality glasses that may be used in connection with embodiments of this disclosure.
Figure 18:
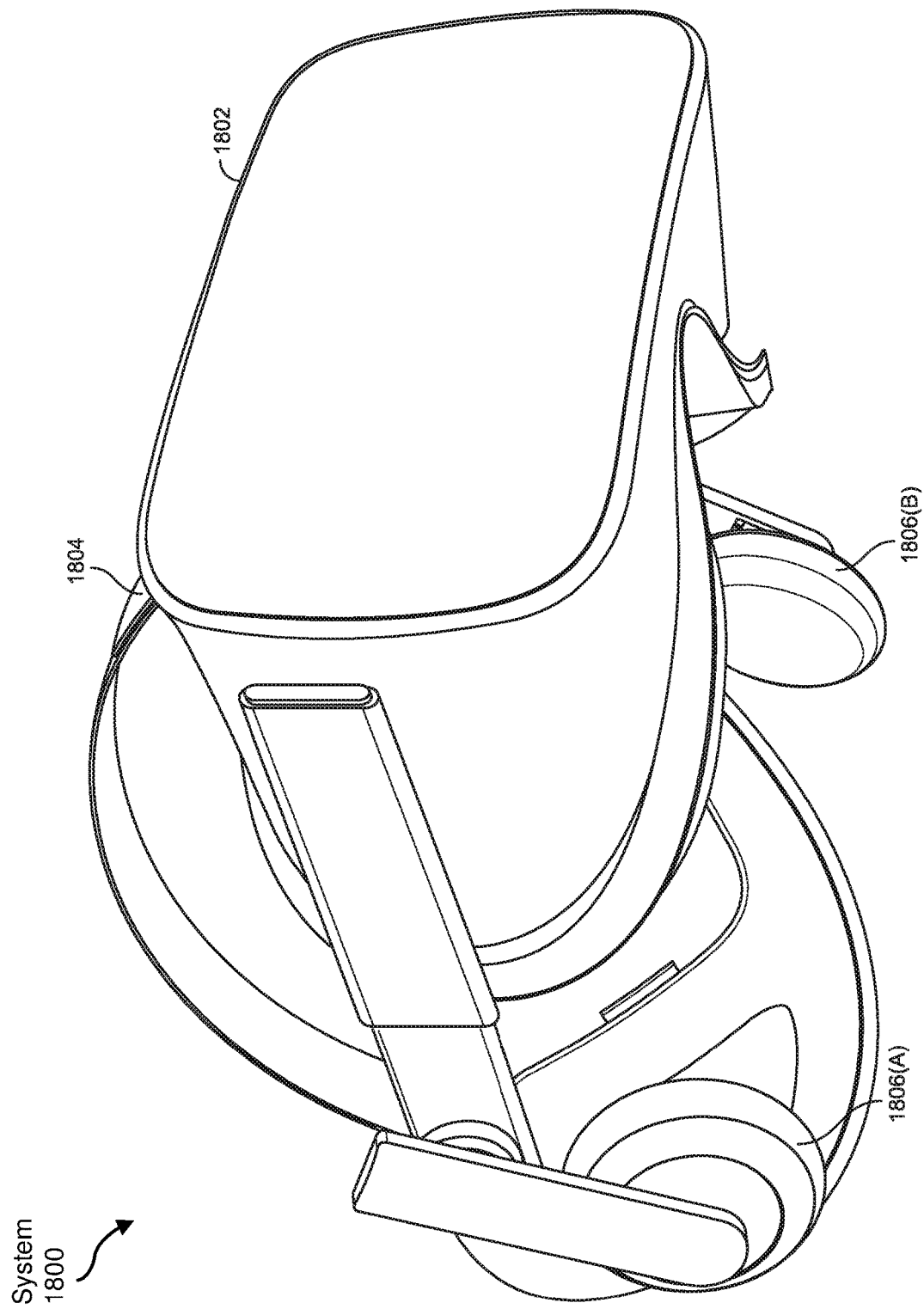
FIG. 18 is an illustration of an example virtual-reality headset that may be used in connection with embodiments of this disclosure.

The following will provide, with reference to FIGS. 1A-18, detailed descriptions of GRIN optical elements, systems and apparatuses including GRIN optical elements, and methods for manufacturing GRIN optical elements. The discussion associated with FIGS. 1A-5C and 11-14 includes detailed descriptions of GRIN optical elements and processes for forming GRIN optical elements, in accordance with various embodiments. With reference to FIGS. 6-10 detailed descriptions of optical arrays and systems including multiple GRIN optical elements and arrays are provided. With reference to FIG. 15, detailed descriptions of methods for fabrication of GRIN optical elements are provided. The discussion associated with FIGS. 16-18 provides detailed descriptions of various artificial-reality systems. While many of the examples discussed herein may be directed to HMD systems, embodiments of the instant disclosure may be implemented in a variety of different types of devices and systems.

As used herein, the terminology "nanovoids," "nanoscale voids," "nanovoided," and the like, may refer to voids having at least one sub-micron dimension, i.e., a length and/or width and/or depth, of less than 1000 nm. In some embodiments, the void size may be between approximately 5 nm and approximately 1000 nm, such as between approximately 5 nm and approximately 200 nm (e.g., approximately 5 nm, approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

GRIN optical elements including nanovoided materials may be formed in any suitable manner. According to some embodiments, the nanovoided material may include a bulk matrix and a plurality of nanoscale voids dispersed throughout the bulk matrix. In some embodiments, the bulk matrix may include a reversibly or irreversibly deformable material that is compressible and/or moldable. In at least one example, the bulk matrix material may include a resilient material, such as an elastomeric material, that is capable of at least partially returning to an initial shape following deformation. In additional examples, the bulk matrix may include an inelastic or substantially inelastic material in order to retain or approximately retain a desired shape. In at least one example, the bulk matrix may include one or more polymer materials, such as polydimethylsiloxane (PDMS), acrylates, and/or poled polyvinylidene fluoride (PVDF) or its co-polymers such as poly(vinylidenefluoride-co-trifluoroethylene) (PVDF-TrFE). Additional examples of suitable polymer materials forming the bulk matrix may include styrenes, polyesters, polycarbonates, epoxies, halogenated polymers, silicone polymers, and/or other suitable polymer or polymer precursor materials including ethyl acetate, butyl acrylate, octyl acrylate, ethylethoxy ethyl acrylate, 2-chloroethyl vinyl ether, chloromethyl acrylate, methacrylic acid, dimethacrylate oligomers, allyl glycidyl ether, and/or N-methylol acrylamide. In some examples, the nanovoided material may include a polymer aerogel having a bulk matrix or backbone material including one or more of the preceding polymeric components. In additional examples, the nanovoided material may include a cellulose-based bulk matrix material, such as an aerogel including a monolithic cellulose matrix and/or cellulose nanofibers cross-linked with, for example, polysiloxane.

In various examples, the bulk matrix of the nanovoided material may include a silica-based material. For example, the nanovoided material may include a silica aerogel having a solid silica-based bulk matrix formed from, for example, tetramethoxysilane (TMOS) and/or tetraethoxyorthosilicate (TEOS). In some examples, aerogels may include modified and/or composite materials, such as hybrid silica and/or polymer/silica materials (e.g., cross-linked aerogels, x-aerogels, etc.), microfiber-reinforced silica materials, and/or a silica materials formed via reduced bonding (e.g., a silica bulk matrix at least partially formed using a trifunctional compound, such as methyltrimethoxysilane [MTMS]), to reinforce and/or otherwise enhance mechanical properties, such as deformability and/or flexibility, and/or optical properties of the aerogels. Examples of suitable polymer/silica hybrid aerogels may include aerogels having bulk materials including silica backbones modified (e.g., via crosslinking) with one or more polymeric and/or polymer-forming compounds, such as PDMS, polyimides, styrenes, epoxides, cyanocrylates, isocyanates, dianhydrides, and/or diamines. Various hybrid aerogels may include organic linking groups, such as organosilicon compounds, with or without polymeric components. Examples of suitable organic linking compounds may include silsesquioxanes, 1,6-bis(trimethoxysilyl)hexa ne (BTMSH), vinyltrimethoxysilane (VTMS), bis(trimethoxysilylpropyl)amine (BTMSPA), 1,4-bis(triethoxysilyl)-benzene (BTESB), and/or bis[3-(triethoxysilyl) propyl]disulfide (BTSPD). In various examples, silica aerogels may be modified through the application of polymeric layers (e.g., cyanoacrylate) to internal nanovoid surfaces via, for example, chemical vapor deposition and/or atomic layer deposition. In some examples, the nanovoided material may include a transparent silica-based aerogel.

In example nanovoided materials, the nanovoids may be randomly distributed throughout a bulk matrix, without exhibiting any long-range order, or the nanovoids may exhibit a regular, periodic structure having a lattice constant of approximately 20 nm to approximately 1000 nm. In both disordered and ordered structures, the nanovoids may be discrete, closed-celled voids, open-celled voids that may be at least partially interconnected, or combinations thereof. For open-celled voids, the void size may be the average diameter of the cell. The voids may be any suitable size and, in some embodiments, the voids may approach the scale of the thickness of the nanovoided material layer. The density of the nanovoided material may correlate to the size and/or distribution of the nanovoids in the nanovoided material. In certain embodiments, the nanovoids may occupy from approximately 10% to approximately 90% by volume of the nanovoided material (e.g., approximately 10%, approximately 20%, approximately 30%, approximately 40%, approximately 50%, approximately 60%, approximately 70%, approximately 80%, or approximately 90%, including ranges between any of the foregoing values).

According to some embodiments, the nanovoids may be substantially spherical, although the void shape is not particularly limited. For instance, in addition to, or in lieu of spherical voids, the nanovoided material may include voids that are oblate, prolate, lenticular, ovoid, etc., and may be characterized by a convex and/or a concave cross-sectional shape. Moreover, the topology of the voids throughout the bulk matrix may be uniform or non-uniform. As used herein, "topology" may (in some examples), and with reference to nanovoids, refer to their overall arrangement within the nanovoided material and may include their sizes and/or shapes as well as their respective spatial distributions (e.g., number density, periodicity, polydispersity, etc.) throughout the matrix. By way of example, the sizes of the nanovoids and/or the nanovoid size distribution may vary spatially within the nanovoided material (e.g., laterally, radially, and/or with respect to the thickness of the nanovoided material). Further, the size range for the nanovoids (e.g., the polydispersity of the nanovoids) may vary within a factor of about 5× or less. In some embodiments, the shapes of the nanovoids may be any suitable shapes including, but not limited to, spheroid, ellipsoid, or disk-like shapes.

In some examples, solvent may be evaporated from nanovoids of a nanovoided material. In some examples, partial solvent evaporation may be allowed before full curing of a curable precursor mixture forming a nanovoided polymer material. This may induce partial nanovoid collapse and formation of anisotropic nanovoids, such as, for example, ovoid and/or disk-shaped nanovoids. The precursor mixture may, for example, be partially cured before partial (or complete) solvent removal from the nanovoided polymer material, for example, to achieve partial (or otherwise limited) nanovoid collapse. Following partial curing and at least partial removal of the solvent from the nanovoids, the precursor mixture may be further cured and the remaining solvent may then be removed, leaving anisotropic nanovoids in the resulting nanovoided material. In some embodiments, such initial partial curing and subsequent curing may be accomplished via, for example, a two-stage polymerization process to form a network of first and second stage polymers.

In at least one embodiment, a precursor mixture may include an emulsion of polymer forming components that may be partially cured, and the partially cured emulsion may be stretched (e.g., stretched optionally while the emulsion is on a substrate) in one or two directions (e.g., orthogonal directions). Further, the stretching may be about 1.5×(alternatively about 2×, about 3×, or about 5× the original dimensions of the emulsion). Afterwards, the emulsion may be further cured and the solvent may be removed thereafter.

In various embodiments, the nanovoided materials may also include a surfactant. In some embodiments, the surfactant may provide improved compatibility between the polymer and monomer, or between the polymer and the solvent. Alternatively, or in addition, the surfactant may reduce the surface energy of the nanovoids, which can reduce adhesive forces when the nanovoids are compressed, thereby preventing undesirable deformation and/or collapse of the nanovoids. In some embodiments, a surfactant may be added to the nanovoided polymer layer as an interfacial layer coating the nanovoids. The surfactant may be ionic or nonionic, and may include any suitable surfactant (e.g., sorbitane monooleate). In some embodiments, an interfacial layer may be formed from an emulsion or nano-emulsion via, for example, nano-emulsion coating. The surfactant may include fluorinated and perfluorinated materials. The emulsion or nano-emulsion may be formed, for example, via phase inversion, cavitation, high-pressure homogenization, or ultrasonication. Such emulsions or nano-emulsions may require a surfactant in some examples.

Various materials including voids having nanoscale dimensions may possess a number of advantageous attributes. For example, nanovoided materials may exhibit a higher transmission of visible light than their larger voided counterparts. Also, the incorporation of nanovoids into a bulk matrix material may increase the permittivity of the resulting composite. Furthermore, the high surface area-to-volume ratio associated with nanovoided materials may provide a greater interfacial area between the nanovoids and the surrounding bulk material matrix. Additionally, as described in greater detail below, nanovoids may be used to selectively vary effective refractive indices in a precise manner throughout different portions of the nanovoided materials utilized in GRIN optical elements (e.g., a lens or prism), as disclosed herein.

Various manufacturing methods may be used to form nanovoided materials, such as nanovoided polymer elements having disordered arrangements of nanovoids or ordered arrangements of nanovoids. Methods for forming nanovoided polymer elements having randomly-distributed (i.e., disordered) voids include selectively depositing a polymer composition or a polymeric precursor composition to form voids in situ, or depositing a polymer or polymeric precursor composition containing a templating agent and then selectively removing the templating agent, while a regular (i.e., ordered) arrangement of voids may be formed by self-assembly or various lithography techniques. Various other techniques for selectively forming nanovoids that vary in size, shape, and/or density (i.e., local concentration or number density of nanovoids) along one or more axes in a nanovoided material are described in greater detail below.

Example nanovoided polymers (NVPs) may be formed through the polymerization of one or more monomers. The term polymerization may include co-polymerization. A nanovoided polymer may be formed using one or more monomers, such as acrylates (e.g., ethyl acrylate, butyl acrylate, octyl acrylate, ethyethoxy ethyl acrylate, chloromethyl acrylate, methacrylic acid, other acrylates, or some combination thereof), ethers (such as 2-chloroethyl vinyl ether, allyl glycidyl ether, other ethers, or some combination thereof), acrylamides (such as N-methylol acrylamide), amides, styrenes, other vinyl polymers, epoxides, isocyanates, and mixtures thereof. One or more monomers may be combined with a curing agent, such as polyamines, higher fatty acids or their esters, or sulfur may be used. A precursor composition for NVP fabrication may include polymers dissolved in solvents, such as aliphatic, aromatic, or halogenated hydrocarbons, or combinations thereof. The NVP precursor composition may include a non-solvent (e.g., a liquid immiscible with the monomer components) to create an emulsion, e.g., of droplets of monomer in a matrix of an immiscible liquid. The non-solvent may be organic or inorganic, for instance, water or a hydrocarbon, or a highly polar organic compound such as ethylene glycol. Emulsions may require a surfactant. The surfactant may be ionic or nonionic (e.g., sorbitane monooleate). A phase inversion, triggered, e.g., by a change in temperature, may be used to create droplets of non-polymerizable liquid in a liquid matrix including one or more monomers. Polymerization of the monomer(s) then creates a polymer matrix including nanodroplets of the non-polymerizable liquid. After polymerization, any solvent used to dissolve the monomer may become excluded from the polymer matrix and become a component of droplets of a non-polymerizable liquid within the nanovoided polymer matrix. Removal of the non-polymerizable liquid may then provide a nanovoided polymer element.

Figure 1B:
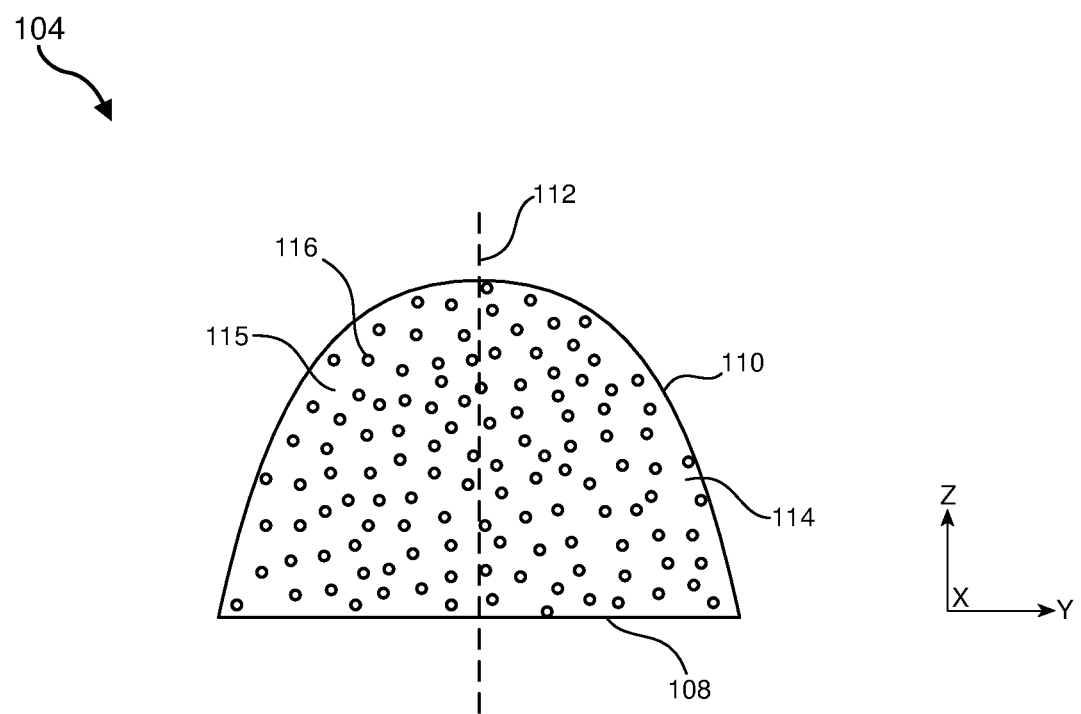
FIG. 1B is an illustration showing additional details of the example lens element of FIG. 1A in accordance with some embodiments.
Figure 2A:
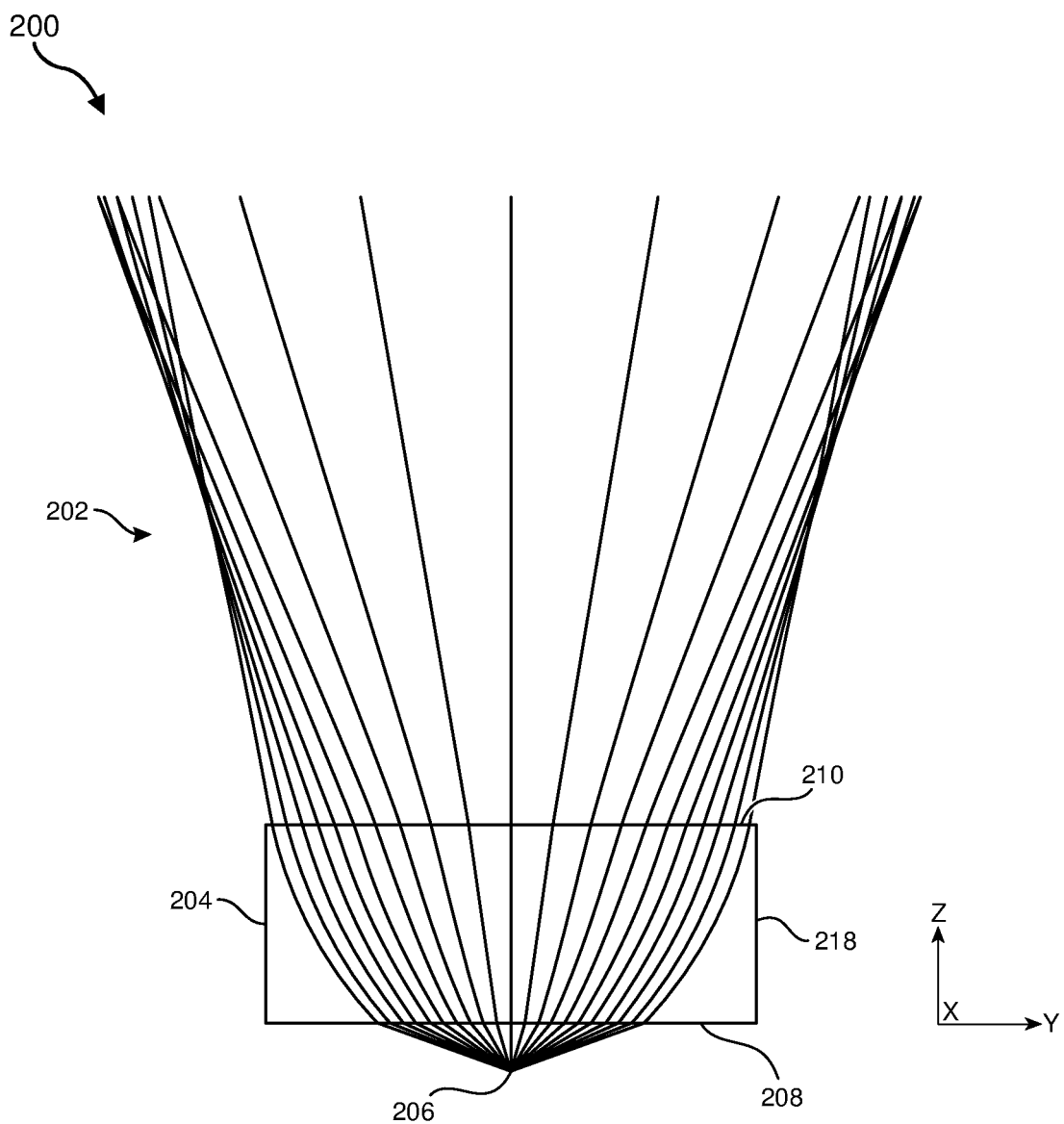
FIG. 2A is an illustration of an example optical system including an example gradient-index (GRIN) lens refracting incident light in accordance with some embodiments.
Figure 2B:
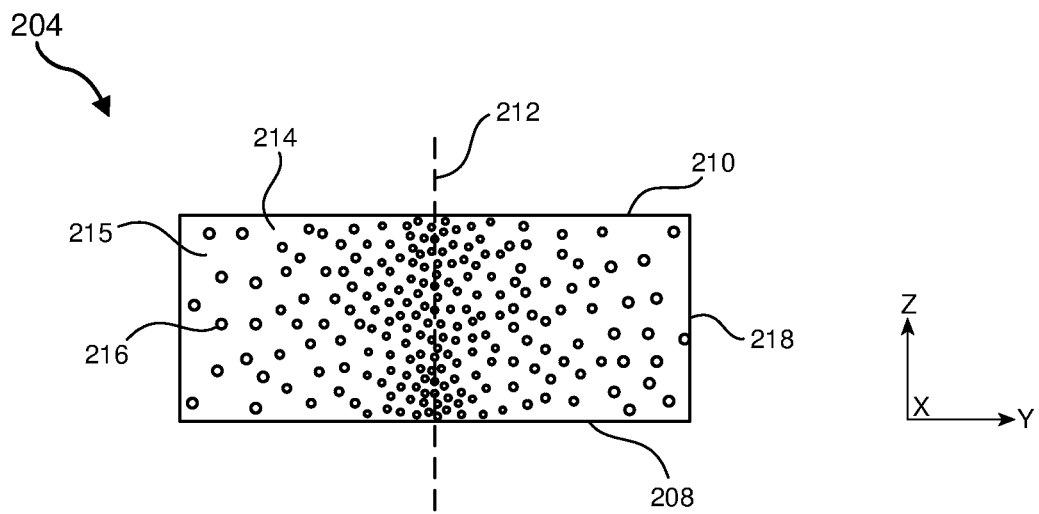
FIG. 2B is an illustration showing additional details of the example GRIN lens of FIG. 2A in accordance with some embodiments.
Figure 2C:
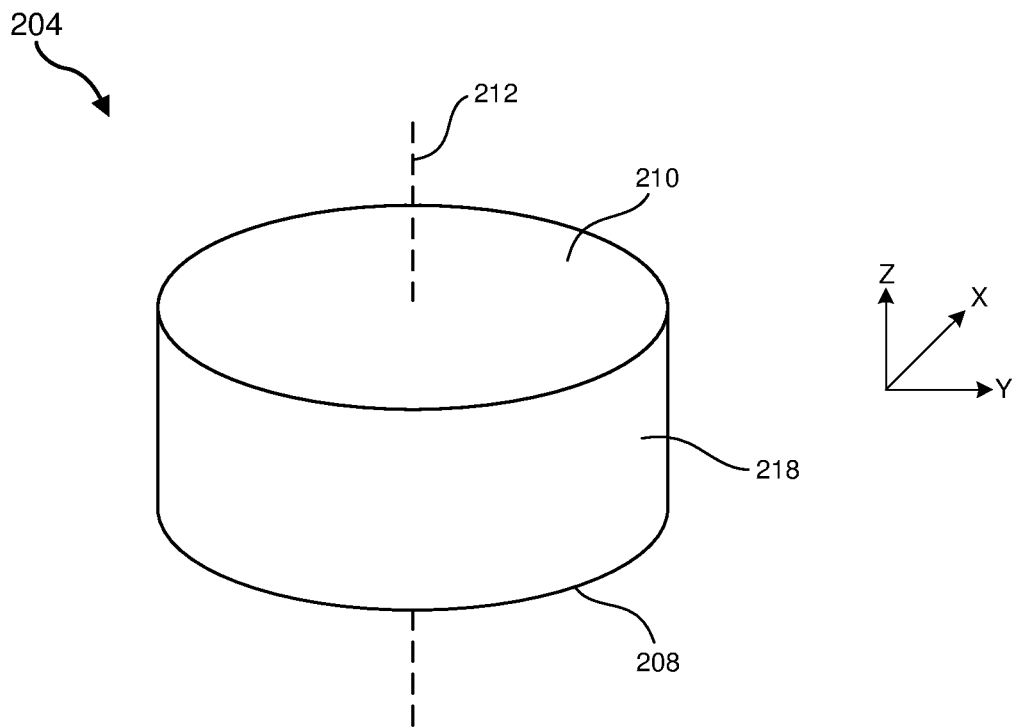
FIG. 2C is an illustration showing a perspective view of the example GRIN lens of FIG. 2A in accordance with some embodiments.

FIGS. 1A and 1B illustrate an exemplary lens element 104 that may be utilized as a precursor element to produce a GRIN optical element, such as a GRIN lens, in accordance with some embodiments. FIGS. 2A-2C illustrate an example GRIN lens 204 that may be formed using any suitable technique, including, for example, compression of a structured precursor element, such as lens element 104.

Figure 3A:
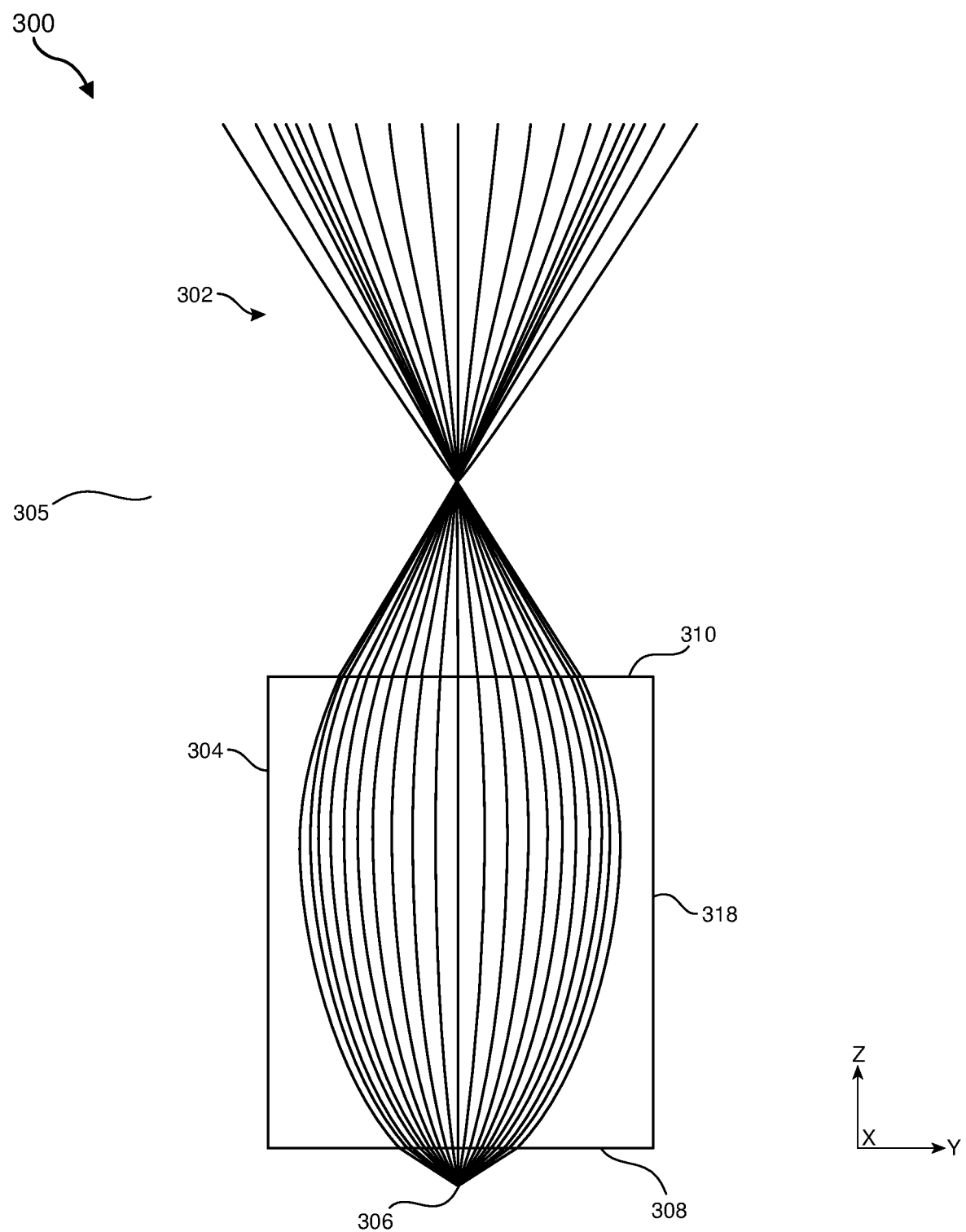
FIG. 3A is an illustration of an example optical system including an example GRIN lens refracting and focusing incident light in accordance with some embodiments.

FIG. 1A shows a side view of an exemplary optical system 100 that includes lens element 104 refracting light 102 (represented, for purposes of illustration, as a ray diagram showing example light ray paths of light 102, with lens element 104 surrounded by a low refractive index medium, such as air; see also FIGS. 2A and 3A, which include illustrative ray diagrams showing example light ray paths). In at least one embodiment, as illustrated in FIG. 1A, light 102 may be emitted from an example point source 106. FIG. 1B illustrates a side view of the exemplary lens element 104 shown in FIG. 1A. As illustrated in FIG. 1B, lens element 104 may include a nanovoided material 114 that includes a plurality of nanovoids 116 that are defined within a bulk matrix material 115 (e.g., a polymer- and/or silica-based material) such that nanovoids 116 are selectively dispersed and/or arrayed throughout bulk matrix material 115. While the nanovoids illustrated throughout the drawings are provided for purposes of illustration, they are not necessarily drawn to scale and the nanovoids may have different sizes and/or shapes, and/or the nanovoids may be present in the nanovoided materials at different concentrations and/or distributions than that shown herein.

Nanovoided material 114 may be transparent and may include a transparent bulk matrix material 115 and nanovoids 116 that are filled with a transparent medium, such as a gas (e.g., air, sulfur hexafluoride, fluorocarbon gas, and/or any other suitable gas), allowing light to readily pass through lens element 104. The sizes, shapes, and/or distribution of nanovoids 116 dispersed in bulk matrix material 115 may be selected to produce a predetermined effective refractive index in nanovoided material 114 and/or to produce a specified effective refractive index gradient in a GRIN optical element (e.g., GRIN lens 204) subsequently formed from lens element 104. As used herein, an "effective refractive index" may refer to the phase delay per unit length of light passing through nanovoided material 114 relative to the phase delay in vacuum. The effective refractive index for a composite material, such as a nanovoided polymer- and/or silica-based material, is not a property of the material per se, but may be determined as a weighted average of the refractive indices of the constituent elements that constitute the composite or a selected region thereof (i.e., the bulk matrix material and gas within the nanovoids). Such a determination may be made using effective medium theory, for example.

In some embodiments, nanovoided materials disclosed herein may include nanovoids having an index of refraction $n_v$ and a permittivity $\varepsilon_v$ (corresponding to a gas, gas mixture, and/or other material disposed within the nanovoids), where $n_v^2 = \varepsilon_v$. Additionally, the bulk matrix material may have an index of refraction $n_b$ and a permittivity $\varepsilon_b$, where $n_b^2 = \varepsilon_b$. In general, the interaction of light with a material, such as a nanovoided material, having a low effective refractive index may depend on a various characteristics of the material such as, for example, the material dimensions, the refractive index of the bulk matrix material, the refractive index of the nanovoids, the nanovoid shapes, the nanovoid sizes, the spatial distribution of the nanovoids, the concentration or number density of the nanovoids within the material, and/or the wavelength of the light. According to some examples, light propagating through a nanovoided material may experience an effective permittivity $\varepsilon_{eff}$. Additionally, an effective refractive index $n_{eff}$ can be expressed in terms of the void refractive index $n_v$, the refractive index $n_b$ of the bulk matrix material, and the void porosity or volume fraction "f."

In nanovoided materials disclosed herein, the voids, including nanovoids, may be sufficiently small so that light cannot resolve the shapes and features of the individual nanovoids. In the disclosed nanovoided materials, at least a majority of the nanovoids (e.g., approximately 60%, approximately 70%, approximately 80%, approximately 90%, greater than approximately 90%) may have a size, such as an average diameter and/or particle size, that is approximately λ/20 or less (e.g., approximately λ/20, approximately λ/15, approximately λ/12, approximately λ/10, approximately λ/9, approximately λ/8, approximately λ/7, approximately λ/6, approximately λ/5, or less than approximately λ/5), where λ is a specified wavelength of light. Accordingly, at least a majority of the nanovoids in the disclosed nanovoided materials may be sufficiently small such that their primary optical effect is to reduce the effective index of refraction.

When the nanovoids in nanovoided materials are sufficiently small, as discussed above, then the nanovoided materials may have an effective permittivity $\varepsilon_{eff}$ expressed as:

$$\varepsilon_{eff} = f\varepsilon_v + (1-f)\varepsilon_b$$

In these embodiments, the effective index $n_{eff}$ of the nanovoided materials can be expressed as:

$$n_{eff}^2 = f n_v^2 + (1-f)n_b^2$$

In some embodiments, such as when difference between the indices of refraction of the nanovoids and the bulk matrix material is sufficiently small, the effective refractive index of the nanovoided materials may be approximated by the following expression:

$$n_{eff} = f n_v + (1-f)n_b$$

In these embodiments, the effective refractive index of the nanovoided materials may be calculated as a volume weighted average of the indices of refraction of the nanovoids and the bulk matrix material. In at least one embodiment, the nanovoids may contain a gas or gas mixture, such as air, such that the refractive index $n_v$ for the nanovoids is approximately 1.00. For example, a nanovoided material that has a void volume fraction of about 50% and a bulk matrix material that has an index of refraction of about 1.5 may have an effective index of about 1.25.

In some embodiments, nanovoided material 114, which is in an uncompressed state, may have an effective refractive index in a range of from approximately 1.0 to approximately 1.3 (e.g., from approximately 1.05 to approximately 1.15). In one example, nanovoided material 114 may have an effective refractive index of approximately 1.06. As will be discussed in greater detail below, compressing portions of a nanovoided material, such as nanovoided material 114, may cause a proportional reduction in the nanovoid volume fraction in the compressed portions due to the much greater compressibility of the gas-filled nanovoids in comparison to the solidified bulk matrix material. Accordingly, such compression of one or more regions of the nanovoided material may result in proportionally higher effective refractive indices in such compressed regions. Further, the amount of compression may be selectively varied in the nanovoided material to produce a corresponding effective refractive index gradient proceeding in one or more directions.

In some examples, lens element 104 may be structured such that it is capable of at least partially dispersing, collimating, focusing, and/or otherwise refracting light in a desired manner that is the same as, or similar to, a conventional lens. For example, lens element 104 may include surfaces that are shaped such that light 102 that is emitted from a point source 106 and incident on lens element 104 is at least partially collimated or focused within a selected field. For example, light 102 emitted from representative point source 106 (which may approximate, e.g., light emitted from an LED, laser light, such as light from an injection laser diode, etc.) may impinge on lens element 104 and may be refracted by lens element 104 as shown in FIG. 1A. In some embodiments, lens element 104 may have a shape that does not focus, collimate, or otherwise refract light in a manner suitable for use in a functional, but which is nonetheless well-suited for forming a GRIN lens as described herein.

In some embodiments, the index of refraction of lens element 104 in any region may be obtained through selective formation and distribution of nanovoids 116 in the region. For example, the topology of nanovoids 116, including the size, shape, polydispersity, and/or concentration of nanovoids 116 within nanovoided material 114, may be selected to produce a desired effective refractive index. Additionally, selected materials (e.g., polymers, silanes, and/or additives) forming bulk matrix material 115 and filling nanovoids 116 (e.g, a gas or gas mixture, such as air) may be used to tune the effective refractive index of nanovoided material 114 as desired. In some examples, nanovoided material 114 may have a relatively low refractive index in comparison to conventional materials that do not include nanovoids. In at least one example, nanovoided material 114 may have an effective refractive index approaching that of air. For example, nanovoided material 114 may have an effective refractive index of between approximately 1.0 and approximately 1.15 (e.g., approximately 1.01, approximately 1.02, approximately 1.03, approximately 1.04, approximately 1.05, approximately 1.06, approximately 1.07, approximately 1.08, approximately 1.09, approximately 1.10, approximately 1.11, approximately 1.12, approximately 1.13, approximately 1.14, approximately 1.15 or greater). In various embodiments, nanovoided material 114 may have a homogeneous or substantially homogeneous distribution of nanovoids 116 throughout. In additional embodiments, the distribution of nanovoids 116 may vary in different regions of nanovoided material 114.

Lens element 104 may have any suitable surface profile and/or shape. In at least one example, as shown in FIGS. 1A and 1B, lens element 104 may have a first lens surface 108 that is planar (e.g., aligned along the illustrated X- and Y-axes), substantially planar, or any other suitable surface shape. Additionally, lens element 104 may include a second lens surface 110 having a selected curvature. For example, second lens surface 110 may have a convex curvature (e.g., a spherical, partial-spherical, paraboloid, lenticular, aspheric, anamorphic, or any other suitable arcuate shape) with, for example, a parabolic, partial-circular, substantially parabolic or partial-circular, or other suitable cross-sectional profile for at least partially focusing, collimating, and/or otherwise refracting, in a desired manner, light emitted from a region near first lens surface 108, such as light 102 that is emitted from point source 106 and incident on first lens surface 108. Lens element 104 may be centered about an optical axis 112 extending between first lens surface 108 and the center (i.e., apex) of second lens surface 110 along the illustrated Z-axis. In this configuration, light may be refracted based on a curvature of second lens surface 110 and also based on the effective index of refraction (which may or may not vary) within lens element 104. In some embodiments, lens element 104 may be designed to direct light in a desired manner. For example, lens element 104 may refract light 102 from point source 106 such that light 102 exiting second lens surface 110 has a narrower field than that emitted by point source 106. In some embodiments, lens element 104 may have surface shapes configured to focus light that is incident on second lens surface 110 at a particular focal point.

FIGS. 2A-2C illustrate an exemplary GRIN lens formed of a nanovoided material and having a refractive index gradient that varies in one or more dimensions in accordance with variations in nanovoids dispersed within the nanovoided material. FIG. 2A shows a side view of an exemplary optical system 200 that includes a GRIN lens 204 refracting light 202 emitted from a point source 206.

An optical element that includes a nanovoided material may be utilized to form a GRIN optical element having a reduced size and more favorable dimensions, in comparison to conventional optical elements, for use in a variety of applications. For example, a lens element 104, as described above in reference to FIGS. 1A and 1B, may be used to form GRIN lens 204, which is substantially reduced in size in comparison to lens element 104. GRIN lenses, as described herein, such as GRIN lens 204, may be utilized alone or in an array (e.g., a microlens array) in various optical devices and/or systems. In some examples, disclosed GRIN lenses may be used in optical devices to, for example, focus light emitted by a display toward a user's eye and/or toward other optical components in a display system (e.g., a virtual-reality, augmented-reality, or mixed-reality system). Additionally, or alternatively, GRIN lenses disclosed herein may be utilized to focus light on a light sensor, such as a photodiode, utilized in a camera or sensor device. In various embodiments, GRIN lenses may be utilized to collimate or reimage light. For example, the described GRIN lenses may be utilized in various optical systems, such as a fiber optic systems, to collimate or reimage light as the output of a fiber. Example GRIN lens applications may involve collimating laser light, coupling the output of diode lasers into fibers, or focusing laser light onto a detector.

According to some embodiments, as will be described in greater detail below, a precursor optical element, such as lens element 104, may be compressed along one or more directions to form a GRIN optical element, such as GRIN lens 204, that refracts light in a manner similar or substantially similar to the precursor optical element. For example, lens element 104 may be compressed along its optical axis 112 to form GRIN lens 204 having a substantially reduced thickness in comparison to lens element 104. Additionally, GRIN lens 204 may have an exterior shape that differs significantly from that of lens element 104. For example, as shown in FIG. 2A, GRIN lens 204 may have a first lens surface 208, a second lens surface 210 that is parallel or substantially parallel to first lens surface 208, and a lateral surface 218 extending between first lens surface 208 and second lens surface 210. In some examples, first lens surface 208 and/or second lens surface 210 may have a planar or substantially planar shape. In additional examples, second lens surface 210 may have a nonplanar shape, such as a convex shape having a reduced degree of curvature in comparison to second lens surface 110 of lens element 104 (see, e.g., FIG. 14). In some embodiments, GRIN lens 204 may have a cylindrical or substantially cylindrical or disc shape, as illustrated in FIG. 2C, or any other suitable shape (see, e.g., FIGS. 9 and 10).

FIG. 2B illustrates a side view of the exemplary lens element 204 shown in FIG. 2A. As illustrated in FIG. 2B, GRIN lens 204 may include a nanovoided material 214 having a plurality of nanovoids 216 that are selectively dispersed and/or arrayed throughout a bulk matrix material 215, such as a bulk polymer- and/or silica-based matrix. An effective index gradient of GRIN lens 204 may be effectuated by variations in the size, shape, density, periodicity, polydispersity, and/or distribution of nanovoids dispersed in the bulk matrix material 215 such that light 202 that is emitted from a selected location, such as exemplary point source 206 illustrated in FIG. 2A, and that is incident on GRIN lens 204 may pass through and be refracted by nanovoided material 214 in a manner similar or comparable to light 102 passing through lens element 104 such that light 202 is at least partially dispersed, collimated, and/or focused by GRIN lens 204. However, such refraction of light 202 may be accomplished primarily, or in large part, based on characteristics of nanovoided material 214, such as an effective refractive index in one or more regions traversed by light 202, in contrast to refraction based primarily on a lens surface shape (see, e.g., FIG. 1A). The light 202 passing through and refracted by nanovoided material 214 of GRIN lens 204 may exit from second lens surface 210 with a narrower field of light than that initially emitted from point source 206. Because lens element 204 may not rely on a curved lens surface to refract light in a desired manner, lens element 204 may have a substantially reduced size (e.g., reduced thickness along optical axis 212) and a reduced light path length through nanovoided material 214 in comparison to conventional lenses while exhibiting equivalent or improved optical characteristics.

In some embodiments, the effective index of refraction of nanovoided material 214 in any region of GRIN lens 204 may be obtained through selective formation and distribution of nanovoids 216 in the region. In at least one example, a denser and/or more compressed region of nanovoids 216 may have a relatively higher refractive index while a less dense and/or compressed region may have a relatively lower refractive index. In various embodiments, the topology of nanovoids 216, including the distribution, concentration, polydispersity, size, and/or shape of nanovoids 216 in nanovoided material 214, may change along one or more axes of GRIN lens 204. For example, the distribution of nanovoids 216 in nanovoided material 214 may transition from a region having a lower void volume fraction and/or a smaller average nanovoid size at a center of GRIN lens 204 located at and/or near optical axis 212 to a region having a greater void volume fraction and/or a larger average nanovoid size at an outer periphery of GRIN lens 204 located at and/or near lateral surface 218. While the number of nanovoids 216 per volume of nanovoided material 214 may be greatest at or near optical axis 212, the nanovoid volume fraction may nonetheless be lower in this region due to the significant reduction in size of nanovoids 216 due to the compressive forces at or near optical axis 212.

Additionally, the effective refractive index of GRIN lens 204 may transition along a gradient in conjunction with the varying distributions and/or sizes of nanovoids 216, from a higher refractive index at and/or near optical axis 212 to a lower refractive index at and/or near lateral surface 218. In some embodiments, distributions of nanovoids 216 may vary so as to produce a parabolic or substantially parabolic transition in refractive index in GRIN lens 204. In various examples, the effective refractive index may vary from a maximum of about 1.6 at optical axis 212 to a minimum of about 1.1 (e.g., about 1.06) at a peripheral region adjacent to lateral surface 218. In some embodiments, first lens surface 208 and/or or second lens surface 210 may have a nonplanar surface shape (e.g., a convex surface). For example, second lens surface 210 may have convex shape dimensioned to further refract light that has been refracted by a refractive gradient of nanovoided material 214 in a desired manner.

The varying regions of nanovoid topology throughout GRIN lens 204 may correlate to an initial shape of lens element 104 (see FIG. 1B) used to form GRIN lens 204 (see FIG. 2B). For example, as will be described in greater detail below, GRIN lens 204 may be formed by compressing lens element 104 in the Z-axis direction along optical axis 112. During the formation of GRIN lens 204, the thickness of lens element 104 may be reduced along optical axis 112 as lens element 104 is compressed by external forces. In some examples, such external forces may be applied to lens element 104 via a compressing element having a planar or substantially planar surface, or in some examples, a nonplanar surface (e.g., a curved convex surface having a degree of curvature that is less than that of second lens surface 110). The compressing element may abut and press against second lens surface 110, with the compressive forces first impacting thicker portions of lens element 104 at or near optical axis 112. Following compression of lens element 104 to form GRIN lens 204, portions of GRIN lens 204 corresponding to portions of lens element 104 having the greatest thickness along the illustrated Z-axis, such as an apical portion of GRIN lens 204 located at or near optical axis 212, may be compressed to the greatest extent. Other portions of GRIN lens 204 disposed radially outward from optical axis 112 that correspond to portions of lens element 104 having lesser thicknesses along the Z-axis may experience lower degrees of compression. Since the thickness of lens element 104 varies according to the curvature of second lens surface 110, which slopes from a maximum thickness at optical axis 112 to a minimum thickness at a lateral periphery of lens element 104, the resulting degrees of compression in various portions of nanovoided material 214 may likewise vary in a continuous or substantially continuous manner along a nonlinear gradient (e.g., a radial gradient) proceeding from a central region of maximal compression at optical axis 212 to a peripheral region of minimal compression adjacent lateral surface 218.

An amount of compression in various regions of nanovoided material 214 may directly correlate to effective refractive indices in those regions. Such a correlation may owe to the fact that nanovoids dispersed within a nanovoided material may alter various optical characteristics, including the refractive index, of the nanovoided material. A nanovoided material may be manufactured according to any of the techniques disclosed herein and/or any other suitable technique to produce nanovoids having selected sizes, shapes, concentrations, and/or distributions within a bulk matrix material defining the nanovoids. In various examples, the resulting nanovoided material may have an effective refractive index that is lower than the refractive index of a non-nanovoided material having the same composition as the bulk matrix material. For example, a particular material, such as a polymer- and/or silica-based material, that is not nanovoided may have a refractive index of approximately 1.5 or more. Conversely, a selectively nanovoided material that includes the same particular material as a bulk matrix material defining the nanovoids may have a much lower refractive index of between approximately 1.0 and 1.3 when the nanovoided material is in an uncompressed or minimally compressed state.

Compression of a nanovoided material and the attendant decrease in void volumes of the nanovoids may increase the effective refractive index of the nanovoided material. For example, nanovoids within a nanovoided material may be filled with a compressible medium (e.g., a gas or gas mixture, such as air) that is compressed much more readily than the bulk matrix material in response to an externally applied force, resulting in a significantly higher reduction in the nanovoid volumes in comparison to a reduction in volume of the bulk matrix material. As such, the of influence of the smaller nanovoids on the refractive index of the nanovoided material may be diminished, resulting in an increased effective refractive index. Higher degrees of compression of the nanovoided material may result in the effective refractive index of the nanovoided material approaching that of the bulk matrix material itself. Additional compression of the nanovoided material may further affect optical properties of the nanovoided material (resulting, e.g., in an increased refractive index) as the force required to further compress the nanovoids exceeds a threshold amount and the bulk matrix material experiences increasing deformation resulting in increased stress and strain within the bulk matrix material.

Accordingly, an effective refractive index of nanovoided material 214 may vary throughout GRIN lens 204 in accordance with variations in degrees of compression of various regions of nanovoided material 214. For example, the effective refractive index of nanovoided material 214 may have a parabolic, substantially parabolic, or generally parabolic transition (corresponding, e.g., to a parabolic or substantially parabolic shape of second lens surface 110 of precursor lens element 104) along a refractive index gradient proceeding from a maximum refractive index at optical axis 212 to a minimum refractive index adjacent to lateral surface 218. GRIN lens 204 may be formed to include a nanovoided material 214 that has a predefined change in refractive index in at least one axis due to a change in the sizes, shapes, and/or distribution of nanovoids 216. For example, the refractive index gradient may proceed radially outward from optical axis 212 along one or more directions defined by the X- and Y-axes, and additionally the Z-axis in some examples. The variations in the effective refractive index throughout nanovoided material 214 may refract light from a particular light source (e.g., light 202 emitted from exemplary point source 206) along various paths (as represented by the various rays of light 202) through nanovoided material 214 such that a field of light exiting GRIN lens 204 is similar, substantially similar, or comparable to a field of light (e.g., light 102) emitted from a curved surface lens element, such as a precursor lens element (e.g., lens element 104) utilized to form GRIN lens 204 (see e.g., FIGS. 1A and 2A). For example, a field of light produced by GRIN lens 204 may have a profile and/or light distribution that is similar, substantially similar, or comparable to a field of light produced by lens element 104.

Variations in nanovoid topology throughout a nanovoided material resulting in refractive index gradients in GRIN optical elements disclosed herein, such as GRIN lens 204, may be obtained by compressing a nanovoided precursor optical element, such as lens element 104, as described above. Additionally or alternatively, such variations in nanovoids in different regions of a GRIN optical element, such as GRIN lens 204, may be obtained using any other suitable technique. For example, variations in nanovoid size, shape, concentration, periodicity, polydispersity, and/or distribution may be produced during formation and/or processing of a nanovoided material without requiring further compression of the nanovoided material during formation of the GRIN optical element. In at least one example, such techniques may be used to produce a GRIN optical element having voids that vary in the same or similar manner as a GRIN optical element (e.g., GRIN lens 204) produced by forced compression of a precursor optical element as described herein. For example, such a GRIN optical element may be formed through such techniques to include a nanovoided material that varies (e.g., along a gradient) from lower effective refractive index regions having lower number densities of nanovoids (i.e., number of nanovoids per volume of nanovoided material) and relatively larger nanovoids to higher effective refractive index regions having higher number densities of nanovoids and relatively smaller nanovoids. In such examples, the smaller nanovoids in the higher effective refractive index regions may not be compressed in comparison to the lower effective refractive index regions, but rather, such nanovoids may be formed to a smaller shape during formation and/or processing of the nanovoided material.

In additional embodiments, such techniques for forming GRIN optical elements without the use of forced compression may provide GRIN optical elements having refractive index profiles that vary in a manner similar or comparable to a GRIN optical element (e.g., GRIN lens 204) formed through forced compression, but which includes nanovoids having different characteristics and/or distributions than the GRIN optical element formed through forced compression. For example, a GRIN optical element may be selectively formed and/or processed to include a nanovoided material that varies (e.g., along a gradient) from lower effective refractive index regions having higher number densities of nanovoids to higher effective refractive index regions having lower number densities of nanovoids, with the average sizes of the nanovoids being the same, substantially the same, or similar in both the lower and higher effective refractive index regions. Additionally or alternatively, a GRIN optical element may be formed to include a nanovoided material that varies from lower effective refractive index regions having relatively larger nanovoids to higher effective refractive index regions having relatively smaller nanovoids, with the number densities of the nanovoids being the same, substantially the same, or similar in both the lower and higher effective refractive index regions. Any other suitable variations in the topology of the nanovoided materials, including, for example, the size, shape, density, periodicity, polydispersity, and/or distribution of nanovoids, may be utilized to produce GRIN optical elements having desired light refraction characteristics.

In some embodiments, a nanovoided material having variations in nanovoid topology may be selectively formed in a controlled manner by 3-dimensional printing of a curable polymer-forming mixture onto a substrate surface. According to further embodiments, a nanovoided material having selected variations in nanovoids may be formed using photolithography, which may include exposure and developing steps using a focused energy beam or blanket exposure in conjunction with a photomask. Example lithography techniques include optical (e.g., photolithography, UV lithography, etc.), electron beam, imprint, and/or other patterning techniques capable of resolving features on the order of approximately 20 to approximately 1000 nm. Other suitable lithography techniques may include direct write lithography, interferometric lithography, and/or layered imprint lithography techniques. In additional embodiments, nanovoids having selected variations in different regions may be formed in a nanovoided material using various other techniques, including nanoimprint lithography using focused ion beam milling, laser lithography using multi-beam laser interference (e.g., NANOSCRIBE 3D printers), direct laser emitting, and/or any other suitable technique enabling formation of a nanovoided material having selected variations in nanovoid characteristics resulting in refractive index gradients along one or more directions.

The GRIN optical elements disclosed herein, such as GRIN lens 204, may be utilized in any suitable application requiring refraction of light to focus, collimate, spread, redirect, and/or otherwise form a desired light field. For example, such GRIN lenses may be utilized alone or in combination with other lenses and/or optical elements (e.g., in a microlens array as illustrated in FIGS. 6-10) in various optical devices and/or systems. In some examples, GRIN lenses may be used in optical devices to, for example, redirect light from a light source, such as a light emitting diode (LED) (e.g., a microLED) or laser emitter, to produce a more narrow light field from a wider light field emitted by the light source. In at least one example, an array of GRIN lenses may be utilized with a subpixel array of light emitters in a display device. In additional embodiments, GRIN lenses may be used in various systems to focus light toward a user's eye and/or toward other optical components. Additionally, or alternatively, GRIN lenses may be utilized to focus light on light sensors, such as photodiodes, utilized in camera or sensor devices. In various embodiments, GRIN lenses may be utilized, for example, to collimate or reimage light. For example, the described GRIN lenses may be utilized in various optical systems, such as fiber optic systems, to collimate or reimage light as the output of a fiber. Example GRIN lens applications may involve collimating laser light, coupling the output of diode lasers into fibers, or focusing laser light onto a detector.

In various embodiments, the disclosed GRIN optical elements may achieve a substantial degree of refraction without requiring air spaces between exterior surfaces of the GRIN optical elements and other components. For example, GRIN lenses may achieve a definitive amount of light refraction without requiring a curved lens surface, and accordingly, such GRIN lenses may have planar or substantially planar surfaces, or surfaces with a substantially reduced curvature relative to conventional lenses. Thus, the GRIN lenses may be formed in close proximity to and/or abutting adjacent components. The GRIN lenses may therefore achieve high optical power in a compact system. Additionally or alternatively, disclosed GRIN optical components may refract light while achieving very low amounts of dispersion. Moreover, in contrast to conventional GRIN optical elements, which may include multiple layers of different materials having separate refractive indices to produce a suitable index gradient, the disclosed GRIN optical elements may be formed from a single volume of nanovoided material that is shaped and compressed in a desired manner to achieve a particular index gradient.

Figure 3B:
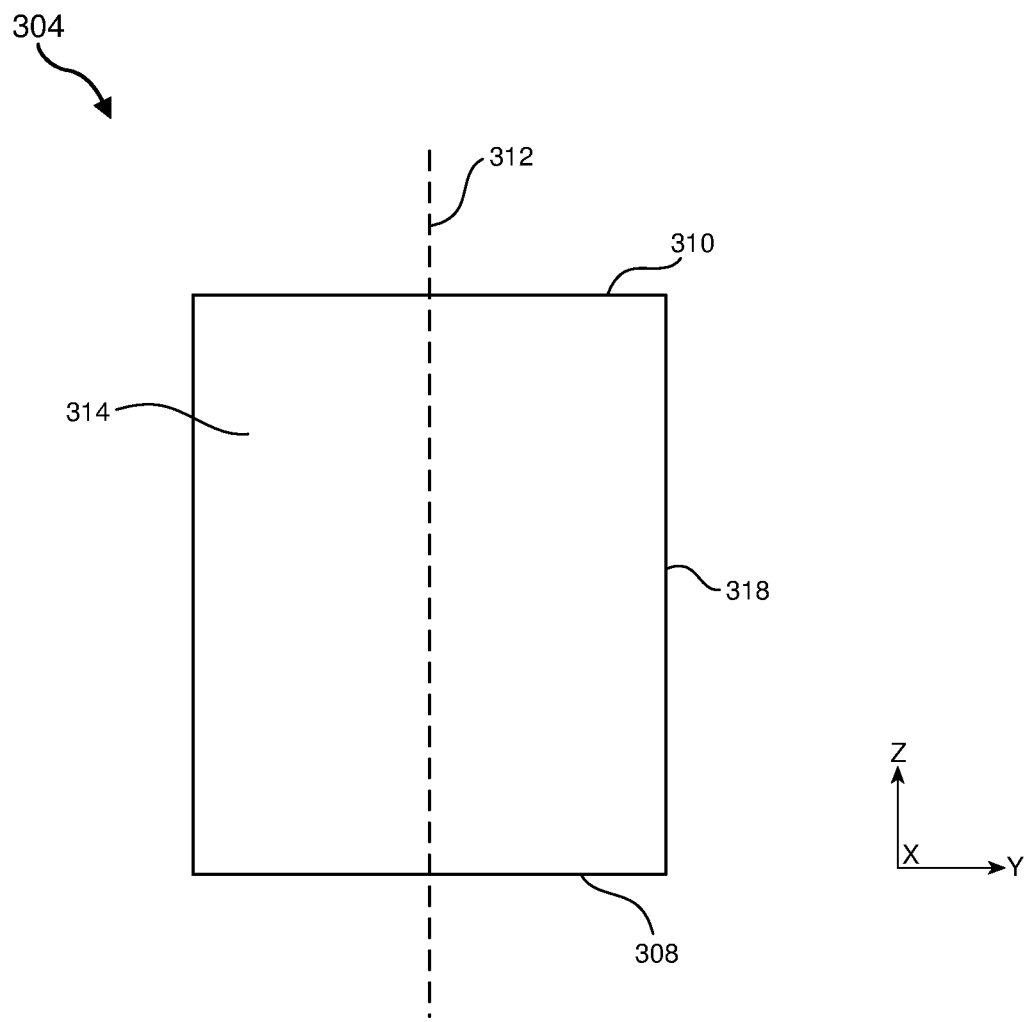
FIG. 3B is an illustration showing additional details of the example GRIN lens of FIG. 3A in accordance with some embodiments.
Figure 4:
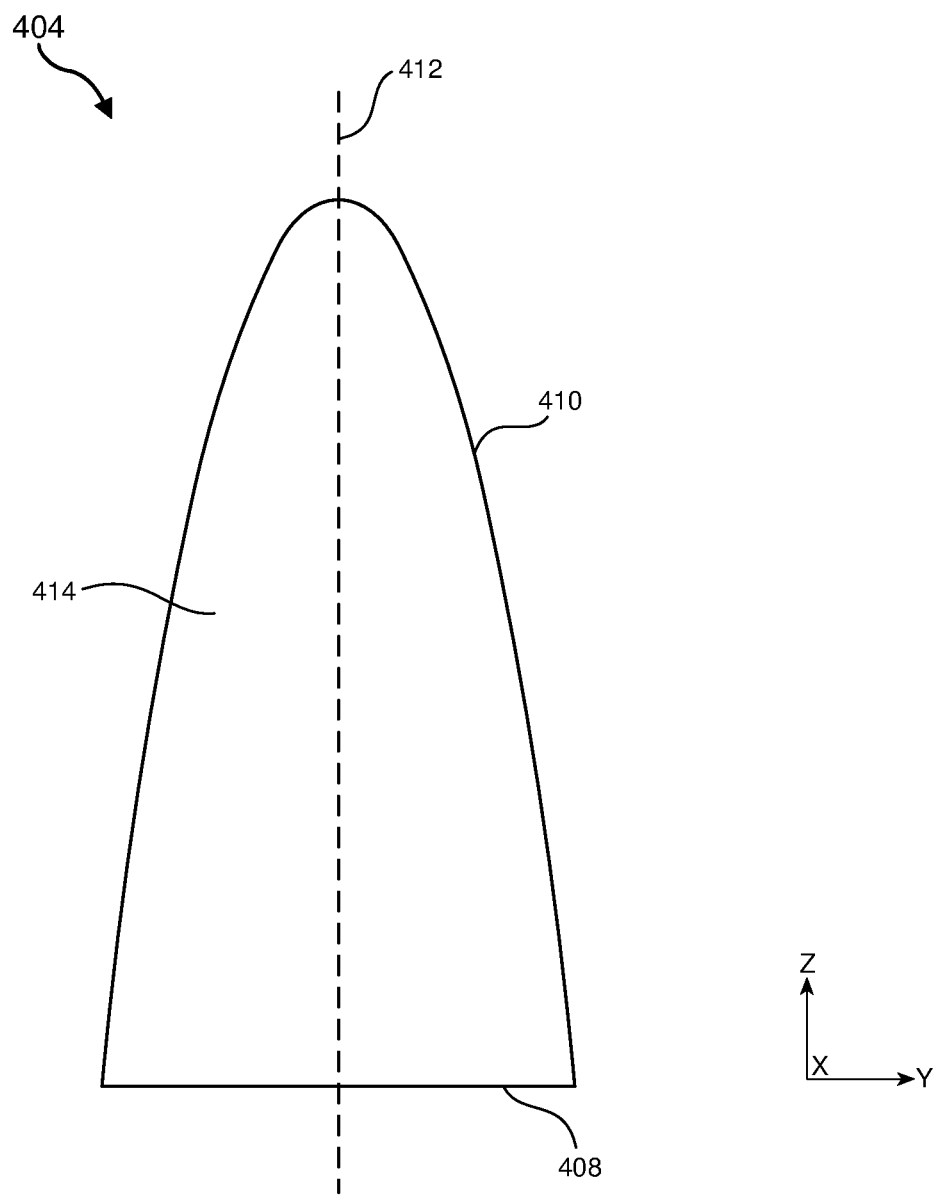
FIG. 4 is an illustration of an example lens element that may be utilized as a precursor element for forming the example GRIN lens of FIG. 3A in accordance with some embodiments.

FIGS. 3A and 3B illustrate an exemplary GRIN lens 304 formed of a nanovoided material and having a refractive index gradient that varies in one or more dimensions in accordance with variations in nanovoids dispersed within the nanovoided material. FIG. 4 illustrates an example lens element 404 that may be utilized to form a GRIN optical element, such as GRIN lens 304, in accordance with some embodiments.

FIG. 3A shows a side view of an exemplary optical system 300 that includes GRIN lens 304 (e.g., a GRIN-rod lens) refracting light 302, which is represented for purposes of illustration as a ray diagram showing example light ray paths of light 302. FIG. 3B shows a side view of the exemplary GRIN lens 304 of FIG. 3A. GRIN lens 304 may have an index gradient that refracts light received at one end of GRIN lens 304 toward a focal point near an opposite end of GRIN lens 304. As illustrated in these figures, GRIN lens 304 may include a first lens surface 308, a second lens surface 310 opposite the first lens surface 308, and a side surface 318 extending between first lens surface 308 and second lens surface 310. In some embodiments, GRIN lens 304 may be centered about an optical axis 312 and may extend longitudinally along optical axis 312 between first lens surface 308 and second lens surface 310. GRIN lens 304 may have any suitable shape, such as a cylindrical or substantially cylindrical shape (see, e.g., FIG. 2C) or a rod shape, with planar or substantially planar first and second lens surfaces 308 and 310 disposed at opposite ends of cylindrical side surface 318. In some examples, first and second lens surfaces 308 and 310 may be parallel or substantially parallel to each other.

GRIN lens 304 may include a nanovoided material 314 (see, e.g., nanovoided material 214 described above in relation to FIGS. 2A-2C) having an effective refractive index gradient that varies from a highest refractive index along optical axis 312 and proceeds radially outward to a lowest refractive index at or near side surface 318. In at least one example, the difference between the highest and lowest refractive indices in GRIN lens 304 may be significantly higher than in conventional GRIN-rod lenses due to the improved range and number of effective refractive indices that may be provided by nanovoided materials. For example, the effective refractive index in GRIN lens 304 may vary from a maximum of about 1.6 at optical axis 312 to a minimum of about 1.1 (e.g., about 1.06) at a peripheral region adjacent to lateral surface 218. Such a range of refractive indices may be significantly greater than conventional GRIN lenses, which may include a central core having a refractive index of approximately 1.6 and a solid material cladding surrounding the central core and having a refractive index of approximately 1.4, or in some cases approximately 1.35. Additionally, in comparison to many conventional GRIN lenses, which may have a single discrete refractive index in each of the core and the cladding, the effective refractive index of GRIN lens 304 may vary continuously or substantially continuously along a gradient between the higher and lower effective refractive indices. Accordingly, GRIN lens 304 may provide a much larger dynamic range, and accordingly, a substantially higher optical power in comparison to existing GRIN lenses. In some embodiments, first lens surface 308 and/or second lens surface 310 may have a nonplanar surface shape (e.g., a convex arcuate surface). For example, second lens surface 310 may have convex shape to further refract light that has been refracted by a refractive gradient of nanovoided material 314 in a desired manner.

An effective refractive index gradient of GRIN lens 304, which corresponds to variations in nanovoid topology in nanovoided material 314, may extend in one or more directions within GRIN lens 304 in a manner similar or comparable to that discussed above in reference to FIGS. 2A-2C, may be designed so that light received from an example point source 306 near one end of GRIN lens 304 is refracted and directed through GRIN lens 304 and toward an example focal point 305 near an opposite end of GRIN lens 304. For example, nanovoided material 314 of GRIN lens 304 may be most highly compressed along optical axis 312, with the amount of compression decreasing along a gradient extending radially outward to a portion of nanovoided material 314 having the lowest amount of compression at or near side surface 318. GRIN lens 304 may extend a greater distance (in relation to first and second lens surfaces 308 and 310) in the direction of its optical axis 312 than lens 204 shown in FIGS. 2A and 2B, allowing for a greater amount of refraction of light 302 as it passes through GRIN lens 304. GRIN lens 304 may be useful in various applications, including those in which it may be desirable to focus light from one location to another over a short distance. For example, GRIN lens 304 may be utilized in fiber optics systems where, for example, focal point 305 is located at an aperture of a connection point or collimator to facilitate source-to-fiber coupling.

While at least a portion of light 302 emitted from point source 306 may initially be oriented radially outward at an angle toward side surface 318, light 302 may be refracted as it passes through the effective refractive index gradient provided in nanovoided material 314 of GRIN lens 304 such that light 302 is directed radially inward at an angle toward optical axis 312 as it approaches second lens surface 310, thus enabling light 302 exiting second lens surface 310 to be focused at focal point 305. As discussed above in relation to FIGS. 2A-2C, an effective refractive index of nanovoided material 314 may vary throughout GRIN lens 304 in accordance with variations in degrees of compression of various portions of nanovoided material 314. For example, the effective refractive index of nanovoided material 314 may have a parabolic, substantially parabolic, or generally parabolic transition along a refractive index gradient proceeding from a maximum refractive index at optical axis 312 to a minimum refractive index adjacent to lateral surface 318. In some examples, GRIN lens 304 may have an effective refractive index gradient that is suited for magnifying light to, for example, optimize optical coupling between a source and destination (e.g., in laser-fiber coupling).

Effective refractive index values for regions of a GRIN lens, such as GRIN lens 304, may be designed to produce desired light refraction suited to form a desired light field and/or focal point, such as focal point 305, from a corresponding light source, such as point source 306. Additionally, the nanovoid topology of nanovoided material 314, including, for example, the size, shape, density, periodicity, polydispersity, and/or distribution of nanovoids in various portions of GRIN lens 304, may be selected to produce a refractive index gradient along at least one direction that includes the determined effective refractive index values. An example technique for determining suitable refractive index values may utilize the following GRIN formula (University of Rochester) to calculate effective index of refraction values, $n_v$ for any location within a GRIN lens (i.e., x, y, and z locations corresponding to the X-, Y-, and Z-axes illustrated in FIG. 3A):

$$n(x,y,z) = n_{00} + n_{01}z^2 + n_{02}z^2 + n_{03}z^3 + n_{04}z^4 + n_{10}r^2 + n_{20}r^4 + n_{30}r^6 + n_{40}r^8$$

where:
r is the radial distance from the optical axis (i.e., optical axis 312), which is related to the x and y locations by:

$$r^2 = x^2 + y^2$$

$n_{00}$ is the nominal index of refraction, and
$n_{01}$ through $n_{40}$ are the coefficients specified for a given wavelength or set of wavelengths (if coefficients are not given at a particular wavelength being traced, coefficients may be interpolated for that wavelength). Example coefficient values used to simulate an index of refraction profile for GRIN lens 304 forming the example field of light 302 illustrated in FIG. 3A for a selected wavelength of 500 nm are illustrated in Table 1:

TABLE 1

GRIN formula coefficient values.

| Coefficient | Value |
|---|---|
| $n_{00}$ | 1.60000 |
| $n_{01}$ | 0.00000 |
| $n_{02}$ | 0.00000 |
| $n_{03}$ | 0.00000 |
| $n_{04}$ | 0.00000 |
| $n_{10}$ | −0.53158 |
| $n_{20}$ | 0.12283 |
| $n_{30}$ | 0.13100 |
| $n_{40}$ | −0.14902 |

While GRIN lens 304 in this particular example is treated as having a radially varying refractive index gradient with no refractive index variation along optical axis 312 (i.e., in the Z-axis direction), in some embodiments, at least a portion of a GRIN lens may additionally have effective refractive indices that vary along a direction parallel to optical axis 312.

According to some embodiments, a precursor optical element that includes a nanovoided material may be utilized to form a GRIN optical element, such as GRIN lens 304. For example, a lens element 404, as shown in FIG. 4, that includes a nanovoided material 414 may be used to form GRIN lens 304, which is substantially reduced in size in comparison to lens element 404. In at least one example, lens element 404 may be compressed in one or more directions to form a GRIN optical element, such as GRIN lens 304, that refracts light in a manner similar, substantially similar, or comparable to lens element 404. For example, lens element 404 may be compressed along its optical axis 412 to form GRIN lens 304 having a substantially reduced size in comparison to lens element 404.

According to at least one embodiment, lens element 404 may have a surface profile and/or shape that differs significantly from that of GRIN lens 304. For example, as shown in FIG. 4, lens element 404 may have a first lens surface 408 that is planar (e.g., aligned along the illustrated X- and Y-axes), substantially planar, or any other suitable surface shape. Additionally, lens element 404 may include a second lens surface 410 having a selected surface profile, such as a convex curvature. For example, as illustrated in FIG. 4, second lens surface 410 may have a convex curvature (e.g., an elongated aspheric shape) with parabolic or substantially parabolic cross-sectional profile, which may be capable of at least partially focusing light emitted from a region near first lens surface 408. Lens element 404 may be centered about optical axis 412 extending between first lens surface 408 and the center (i.e., apex) of second lens surface 410 along the illustrated Z-axis. In this configuration, light may be refracted based on a curvature of second lens surface 410 and also based on the effective index of refraction (which may or may not vary) within lens element 404. Lens element 404 may be designed to direct light in a desired manner. For example, lens element 404 may refract light from a point source near first lens surface 408 (see, e.g., point source 306 in FIG. 3A) such that light exiting second lens surface 410 is focused at a particular point or region.

The varying regions of nanovoid density throughout GRIN lens 304 in FIGS. 3A and 3B may correlate to an initial shape of lens element 404 in FIG. 4 used to form GRIN lens 304. For example, GRIN lens 304 may be formed by compressing lens element 404 in the Z-axis direction along optical axis 412. During the formation of GRIN lens 304, the thickness of lens element 404 may be reduced along optical axis 412 as lens element 404 is compressed by an external force. Following compression of lens element 404 to form GRIN lens 304, portions of GRIN lens 304 corresponding to portions of lens element 404 having the greatest extent along the Z-axis, such as an apical portion of GRIN lens 404 located at or near optical axis 412, may have the highest amount of compression, while other portions of GRIN lens 304 corresponding to portions of lens element 404 extending to lesser degrees along the Z-axis may have lesser amounts of compression. Since the longitudinal extent of lens element 404 varies according to the curvature of second lens surface 410, which slopes from a maximum extent at optical axis 412 to a minimum extent at a lateral periphery of lens element 404, the resulting degrees of compression in various portions of nanovoided material 314 may likewise vary in a continuous or substantially continuous manner along a non-linear gradient (e.g., a radial gradient) proceeding from a central region of maximal compression at optical axis 312 to a peripheral region of minimal compression adjacent lateral surface 318.

While variations in nanovoid topology throughout a nanovoided material resulting in refractive index gradients in GRIN optical elements disclosed herein, such as GRIN lens 304, may be obtained by compressing a nanovoided precursor optical element, such as lens element 404, as described above, such variations in nanovoids may additionally or alternatively be obtained using any other suitable technique. For example, as discussed above in relation to FIGS. 2A-2C, variations in nanovoid size, shape, concentration, periodicity, polydispersity, and/or distribution may be produced during formation and/or processing of a nanovoided material without requiring further compression of the nanovoided material during formation of the GRIN optical element, such as GRIN lens 304. Such techniques may include, for example, 3-dimensional printing, photolithography, UV lithography, electron beam lithography, imprint lithography, nanoimprint lithography, direct write lithography, interferometric lithography, laser lithography, layered imprint lithography, direct laser emitting, and/or any other suitable technique capable of forming a nanovoided material having selected variations in nanovoid topology resulting in refractive index gradients along one or more directions.

Figure 5A:
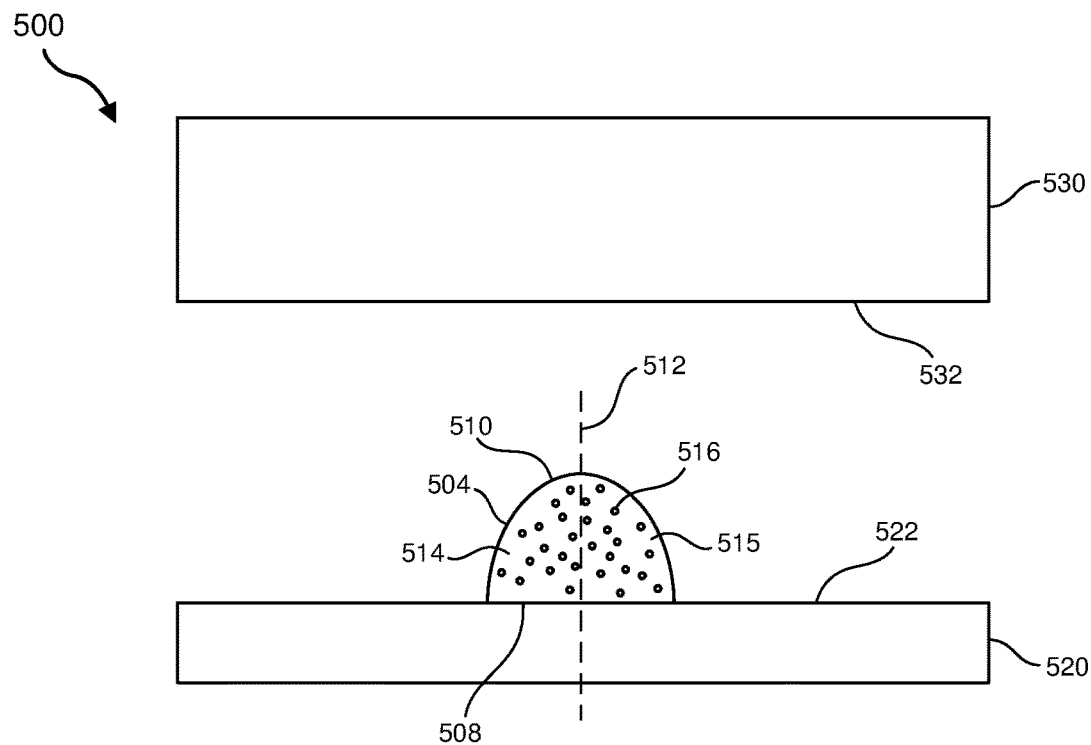
FIG. 5A is an illustration of an example process for forming a GRIN optical element in accordance with some embodiments.
Figure 5B:
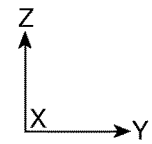
FIG. 5B is an illustration showing a continuation of the example process of FIG. 5A in accordance with some embodiments.
Figure 5B:
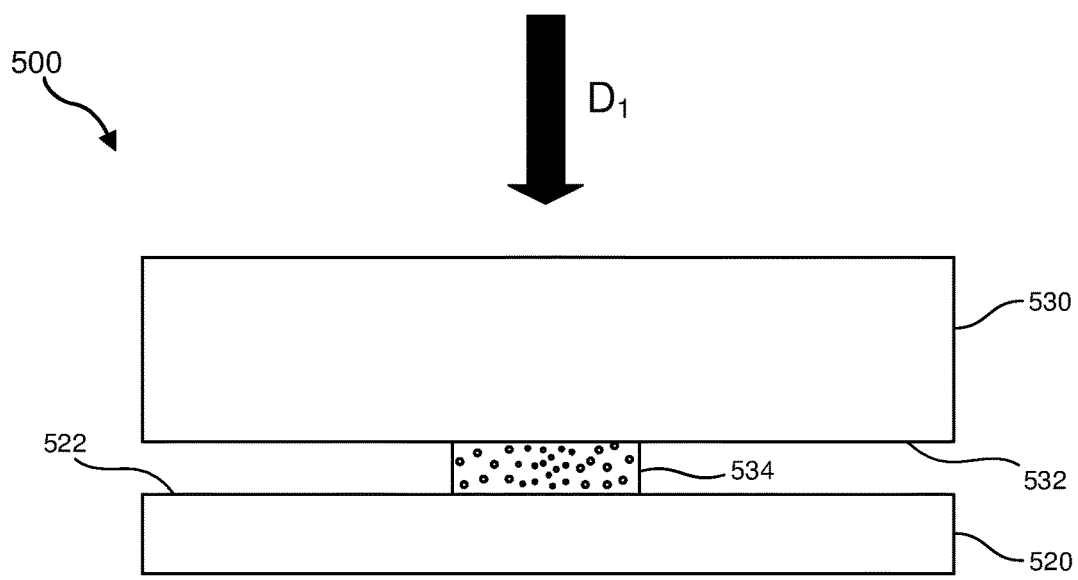
Figure 5C:
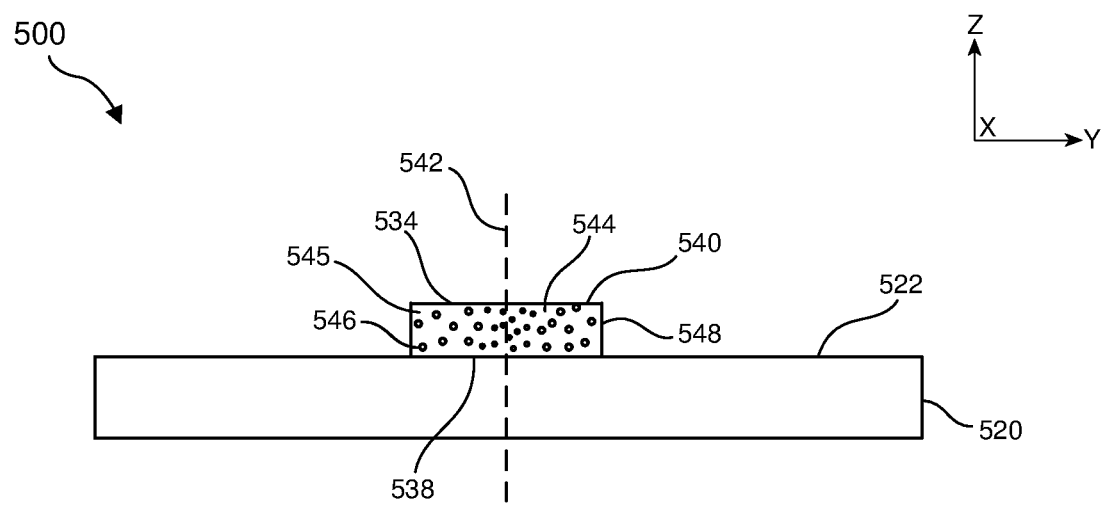
FIG. 5C is an illustration showing a continuation of the example process of FIG. 5A in accordance with some embodiments.

FIGS. 5A-5C are diagrams illustrating an example technique for forming a GRIN lens in accordance with some embodiments. While these figures illustrate an exemplary system and method for forming a GRIN lens, such as GRIN lens 204 illustrated in FIGS. 2A-2C, such a technique may additionally or alternatively be used to form GRIN lens element 304 shown in FIGS. 3A and 3B and/or any other suitable GRIN optical element shown and/or described herein. In at least one embodiment, as shown in FIG. 5A, a system 500 for forming a GRIN lens having a varied nanovoid topology resulting in variations along at least one gradient may utilize a precursor optical element, such as a lens element 504. As shown in this figure, lens element 504 may include a nanovoided material 514 having a plurality of nanovoids 516 defined in a bulk matrix material 515 and a first optical shape including a first lens surface 508 and a second lens surface 510 centered about optical axis 512. Lens element 504 may include any suitable shape, such as, for example, a lenticular, spherical, aspheric, anamorphic, or prism shape. In some embodiments, nanovoided material 514 may have a homogenous or substantially homogenous distribution of nanovoids 516. In at least one embodiment, lens element 504 may be shaped such that light incident on first lens surface 508 and directed through nanovoided material 514 of lens element 504 forms a similar or substantially similar light field as light directed through a resulting GRIN lens (e.g., GRIN lens 534 shown in FIGS. 5B and 5C) formed from lens element 504. Nanovoided material 514 may be formed by any suitable technique, including any of the techniques described herein. In at least one example, nanovoided material 514 may be formed from a curable mixture, which includes a monomer and a solvent, formed in a desired shape. In some examples, the curable mixture may be deposited on a support surface 522 of a substrate 520. The monomer may then be cured and the solvent may be removed from lens element 504 during and/or after the curing. Additionally or alternatively, lens element 504 may be formed and cured prior to positioning lens element 504 on substrate 520.

Subsequently, as shown in FIG. 5B, a molding member 530 or other selectively-shaped forming member may then be brought into contact with lens element 504 such that nanovoided material 514 is compressed between substrate 520, which supports lens element 504, and molding member 530 to form GRIN lens 534. Due to the arcuate surface shape of lens element 504, which is highest in the central apical region of second lens surface 510 at optical axis 512, nanovoided material 514 may experience the greatest amount of compression at optical axis 512 as molding member 530 moves and compresses lens element 504 in direction D1 (i.e., in a direction parallel or substantially parallel to the Z-axis). In at least one example, a lateral forming member may be positioned around and/or abutting at least a portion of lens element 504 to shape a peripheral portion of GRIN lens 534 to a desired surface shape (see, e.g., lateral surface 218 in FIGS. 2A-2C) during compression. For example, a lateral forming member may be positioned on or near support surface 522 such that a cylindrical interior surface of the lateral forming member surrounds a lateral periphery of lens element 504 during and/or following compression between substrate 520 and molding member 530, thereby forming a cylindrical or substantially cylindrical lateral surface on the periphery of GRIN lens 534 (see lateral surface 548 in FIG. 5C) as at least a portion of nanovoided material 514 is forced laterally (e.g., due to stress and/or strain in the bulk matrix material) during molding. Lens element 504, substrate 520, and/or molding member 530 may be maintained at any suitable temperature during molding of lens element 504 to form GRIN lens 534, such as a moderate room temperature or, in some examples, an elevated temperature to facilitate molding and/or further curing of the nanovoided material. A temperature may, for example, be selected to facilitate deformation of the bulk matrix material in the nanovoided material while preventing collapse and/or excessive distortion of the nanovoids.

FIG. 5C illustrates GRIN lens 534 following compression between substrate 520 and molding member 530. As shown in this figure, GRIN lens 534 may be centered about an optical axis 542 and may include a nanovoided material 544 including a bulk matrix material 545 defining a plurality of nanovoids 546 that vary in topology (i.e., size, shape, density, periodicity, polydispersity, and/or distribution) throughout GRIN lens 534. GRIN lens 534 may have any suitable shape and may include, in some examples, a first lens surface 538, a second lens surface 540, and a lateral surface 548 extending between the first and second lens surfaces 538 and 540. In some examples, GRIN lens 534 may be coupled (e.g., bonded) to support surface 522 of substrate 520. In at least one example, substrate 520 may include an optically transparent material that permits passage of light to and/or from GRIN lens 534 such that substrate 520 and GRIN lens 534 may be utilized together as an integral unit in an optical device. According to an additional example, GRIN lens 534 may be removable from substrate 520 to allow for independent positioning of GRIN lens 534 in an optical device.

Following molding, the resulting degree of compression in nanovoided material 544 of GRIN lens 534 may slope from a greatest amount of compression at optical axis 542 to a least amount of compression at or near lateral surface 548. Accordingly, the central region of the resulting GRIN lens 534 may have the highest nanovoid density and the nanovoid density may decrease radially outward from optical axis 542 along a gradient. Assuming a substantially homogenous nanovoid size initially dispersed throughout lens element 504 prior to molding, the central region of GRIN lens 534 may also include nanovoids 546 having the smallest average nanovoid size, with the sizes of the nanovoids progressively increasing along a direction radially outward from optical axis 542. After formation of GRIN lens 534, molding member 530 may be removed, as illustrated in FIG. 5C. While GRIN lens 534 having planar first and second lens surfaces is illustrated in FIG. 5C, any suitable shape of GRIN lens may be formed in the same or similar manner via, for example, a nonplanar forming surface of a molding member (see, e.g., FIG. 14). Additionally or alternatively, any suitable GRIN optical element may be formed by compression of a precursor optical element having any suitable shape in the same or similar manner as that illustrated in FIGS. 5A-5C.

Nanovoided material 514 may include any suitable material having a bulk matrix that is capable of being reversibly or irreversibly deformed through compression to form grin lens 534 including nanovoided material 544. For example, nanovoided material 514 may include a bulk matrix material 515 that is non-elastic or substantially non-elastic such that it may be compressed to form nanovoided material 544, which maintains or substantially maintains the compressed structure following removal of an externally applied force by molding member 530 (see, e.g., FIGS. 5B and 5C). In additional examples, bulk matrix material 515 of nanovoided material 514 may include an elastomeric material such that nanovoided material 514 is elastically deformable. In such examples, the resulting compressed nanovoided material 544, which includes an elastomeric bulk material 545, may tend to at least partially return to the initial shape of lens element 504 shown in FIG. 5A in the absence of an external boundary constraining nanovoided material 544 to the shape of GRIN lens 534 illustrated in FIGS. 5B and 5C. Accordingly, a transparent cover or retaining layer (see, e.g., FIG. 7) may be disposed over at least a portion of GRIN lens 534 so as to contact at least a portion of second lens surface 540 and/or lateral surface 548, thereby maintaining the compressed shape of GRIN lens 534 between substrate 520 and the cover or retaining layer. In additional embodiments, nanovoided material 544 of GRIN lens 534 may be further cured (e.g., using heat, actinic radiation, etc.) during and/or after molding to further solidify nanovoided material 544 and maintain the molded shape of GRIN lens 534.

Figure 6:
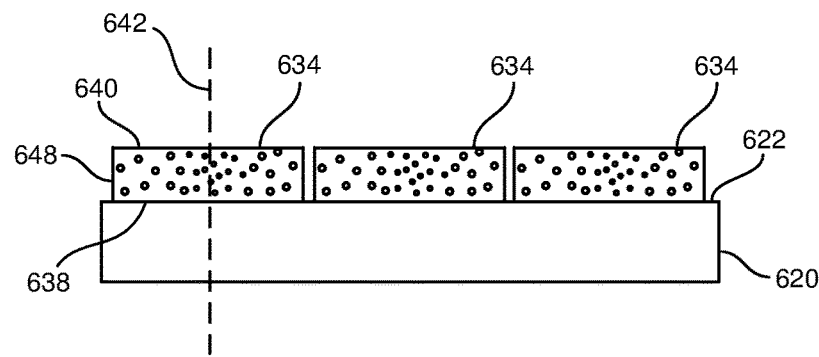
FIG. 6 is an illustration of an example array of GRIN lenses in accordance with some embodiments.

In various examples, multiple GRIN optical elements may be arrayed on a common surface. For example, FIG. 6 illustrates an exemplary array 600 of GRIN optical elements 634 (e.g., GRIN lenses 534 shown in FIG. 5C and/or any other suitable GRIN optical elements disclosed herein) that are disposed on a substrate 606. GRIN optical elements 634 may each be centered about an optical axis 642 and may include a first element surface 638 abutting support surface 622, a second element surface 640 located opposite first element surface 638, and a lateral surface 648 located on a periphery of GRIN optical element 634 and extending between first element surface 638 and second element surface 640. As shown in this figure, the multiple GRIN optical elements 634 may be arrayed on a support surface 622 of substrate 620 within a relatively close proximity to and/or abutting each other. The compressed shapes of GRIN optical elements 634 may take up less space than conventional optical elements utilized in such optical arrays. For example, conventional optical elements, such as arcuate lenses and/or sloping prisms, may, by virtue of their respective shapes, be surrounded by a greater volume of air in spaces located between portions of such optical elements.

Figure 7:
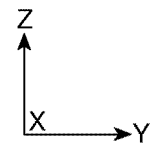
FIG. 7 is an illustration of an example array of GRIN lenses in accordance with some embodiments.
Figure 7:
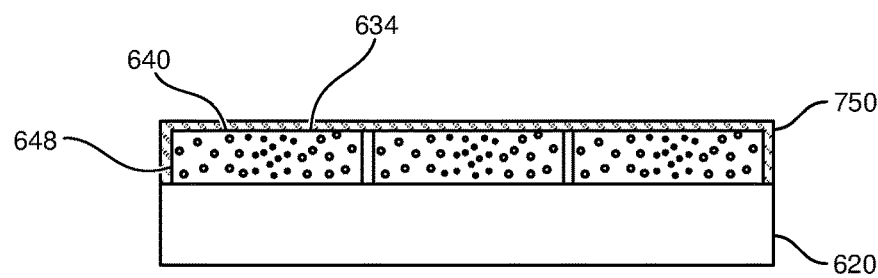

FIG. 7 illustrates an exemplary array 700 that includes a plurality of GRIN optical elements 634 disposed on a substrate 620 (see, e.g., FIG. 6). As shown in FIG. 7, in contrast to conventional optical elements, which may be covered with protective enclosures that surround substantial air gaps located over and/or around the optical elements (e.g., over and around curved and/or sloping surfaces of the optical elements), GRIN optical elements 634 may be at least partially covered with a protective material 750 that abuts one or more surface portions of each GRIN optical element 634 to minimize any wasted air volume and decrease the overall thickness of array 700 along optical axis 642 (i.e., in the Z-axis direction) while protecting GRIN optical elements 634 from wear, damage, and/or contamination. For example, as shown in this figure, protective material 750 may abut second element surface 640 of each GRIN optical element 634 and/or a portion of lateral surface 648 of one or more optical elements 634 located, for example, at peripheral portions of array 700. In some examples, protective layer 750 may extend over and cover gaps, such as gaps 752 located between adjacent GRIN optical elements 634. Additionally or alternatively, protective material 750 may extend to substrate 620 so as to encapsulate GRIN optical elements 634, thereby sealing and protecting GRIN optical elements 634 from external contamination and/or contact.

Figure 8:
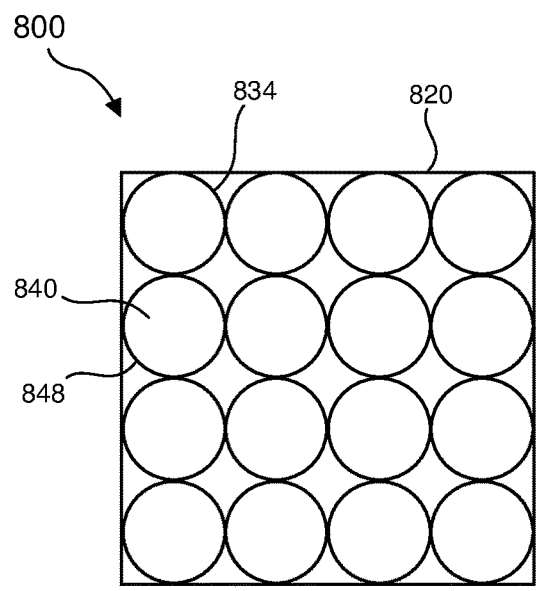
FIG. 8 is an illustration of an example array of GRIN lenses in accordance with some embodiments.
Figure 9:
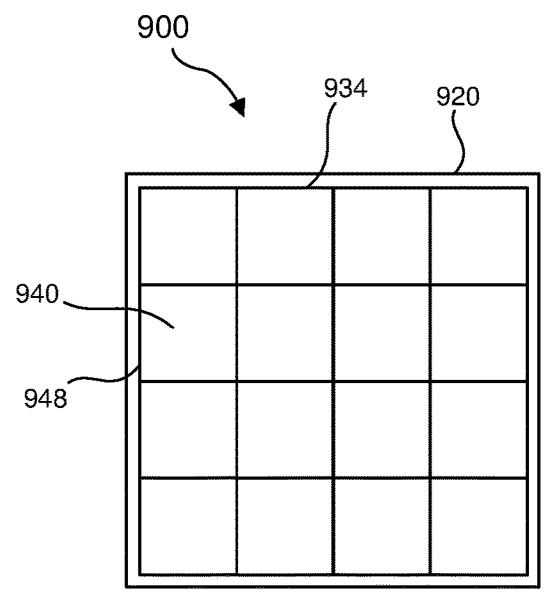
FIG. 9 is an illustration of an example array of GRIN lenses in accordance with some embodiments.
Figure 10:
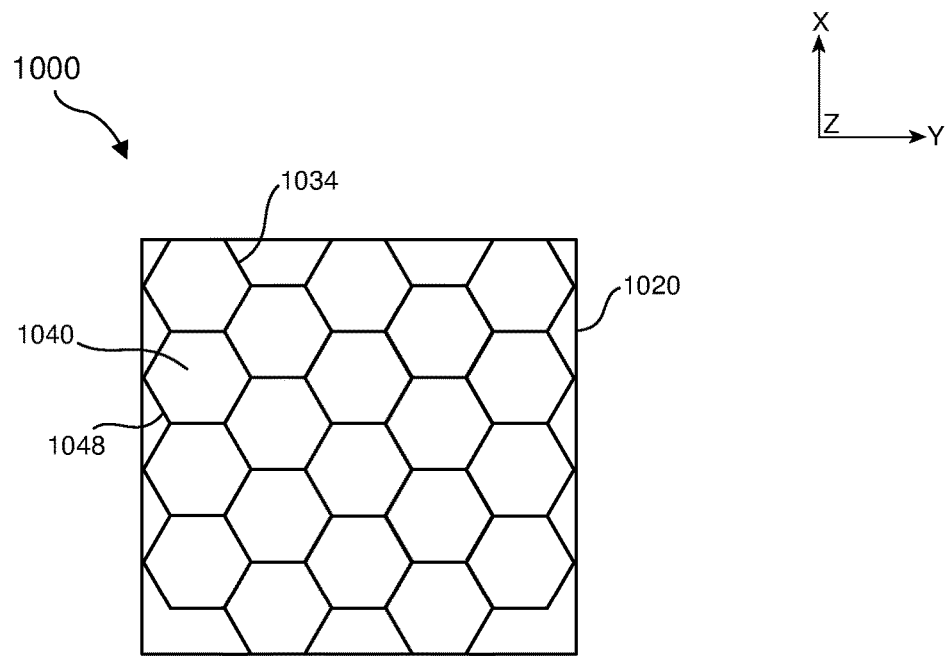
FIG. 10 is an illustration of an example array of GRIN lenses in accordance with some embodiments.

Disclosed GRIN optical elements, such as GRIN optical elements 634 illustrated in FIGS. 6 and 7, may be arrayed in any manner suitable for use in a selected optical device. FIGS. 8-10 illustrate various exemplary configurations of arrayed GRIN optical elements according to some embodiments.

FIG. 8 shows a top view of an exemplary array 800 of GRIN optical elements 834, which may include any suitable GRIN lens or prism as disclosed herein, arranged on a substrate 820. As shown in this figure, array 800 may include a plurality of GRIN optical elements 834, each having a second lens surface 840 (i.e., top surface) and a lateral surface 848 having a circular or substantially circular profile (e.g., defined by a cylindrical or substantially cylindrical surface shape of lateral surface 848). In some examples, GRIN optical elements 834 may be arrayed in columns and rows corresponding, for example, to columns and rows of light-emitting elements (e.g., LEDs, OLEDs, laser-emitting elements, etc.) of a display device or columns and rows of light-sensing elements (e.g., photodiodes, photoactive elements, etc.) of a camera device. In additional examples, alternating rows or columns of GRIN optical elements 834 may be slightly offset from each other along the respective rows or columns by a distance equivalent to approximately have the radius of each GRIN optical element 834. In such a configuration, at least a portion of each GRIN optical element 834 in, for example, a particular column may be partially disposed between two adjacent GRIN optical elements 834 in an adjacent column, thereby reducing the amount of unused space between GRIN optical elements 834 in array 800.

In some examples, GRIN optical elements may have noncircular lateral surface shapes to maximize the amount of usable space occupied by the GRIN optical elements in an array. FIG. 9 shows a top view of an exemplary array 900 of GRIN optical elements 934 arranged on a substrate 920. As shown in this figure, array 900 may include a plurality of GRIN optical elements 934, each including a second lens surface 940 and a lateral surface 948 having a noncircular profile. For example, optical elements 934 may each have a rectangular, substantially rectangular, or generally rectangular profile (e.g., a square or substantially square profile as illustrated in FIG. 9), thereby increasing the packing density of GRIN optical elements 934 and reducing or eliminating the amount of unused space between GRIN optical elements 934 in array 900. In some examples, GRIN optical elements 934 may each be molded or otherwise formed to have a rectangular peripheral profile. Additionally or alternatively, GRIN optical elements 934 may be formed by compressing a lens element or other precursor optical element that also has a rectangular peripheral profile. In some embodiments, GRIN optical elements 934 may be formed by compressing an array of precursor optical elements having non-rectangular peripheries (e.g., lens elements having circular cross-sectional profiles) such that the optical elements at least partially deform and spread outward against adjacent spreading optical elements to form partially or generally rectangular GRIN optical elements 934 (e.g., having non-angular corner regions) and/or substantially rectangular GRIN optical elements 934 in array 900.

FIG. 10 shows a top view of an exemplary array 1000 of GRIN optical elements 1034 arranged on a substrate 1020. As shown in this figure, array 1000 may include a plurality of GRIN optical elements 1034, each including a second lens surface 1040 and a lateral surface 1048 having a noncircular profile. For example, optical elements 1034 may each have a hexagonal, substantially, or generally hexagonal profile, as illustrated in FIG. 10, thereby increasing the packing density of GRIN optical elements 1034 and reducing or eliminating the amount of unused space between GRIN optical elements 1034 in array 1000. In some examples, GRIN optical elements 1034 may each be molded or otherwise formed to have a hexagonal peripheral profile. Additionally or alternatively, GRIN optical elements 1034 may be formed by compressing a lens element or other precursor optical element that also has a hexagonal peripheral profile. In some embodiments, GRIN optical elements 1034 may be formed by compressing an array of precursor optical elements having non-hexagonal peripheries such that the optical elements at least partially deform and spread outward against adjacent spreading optical elements to form partially or generally hexagonal GRIN optical elements 1034 (e.g., having non-angular corner regions) and/or substantially hexagonal GRIN optical elements 1034 in array 1000.

Figure 11:
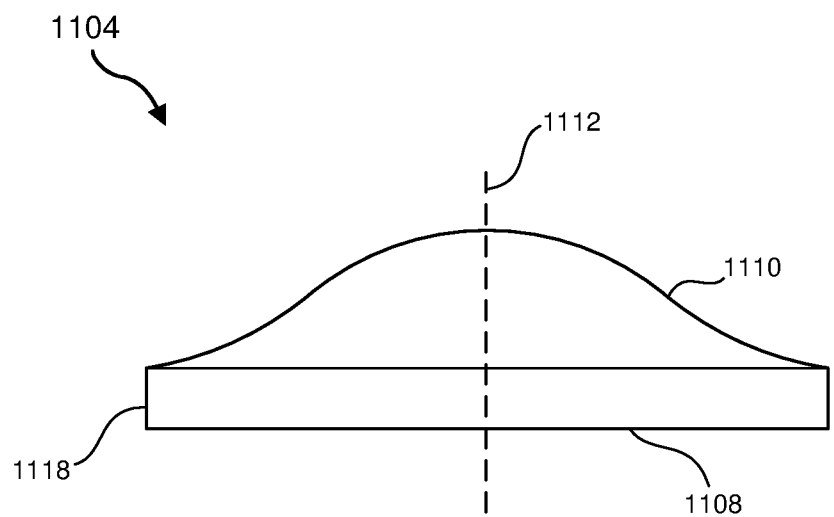
FIG. 11 is an illustration of an example lens element that may be utilized as a precursor element for forming a GRIN lens in accordance with some embodiments.
Figure 12:
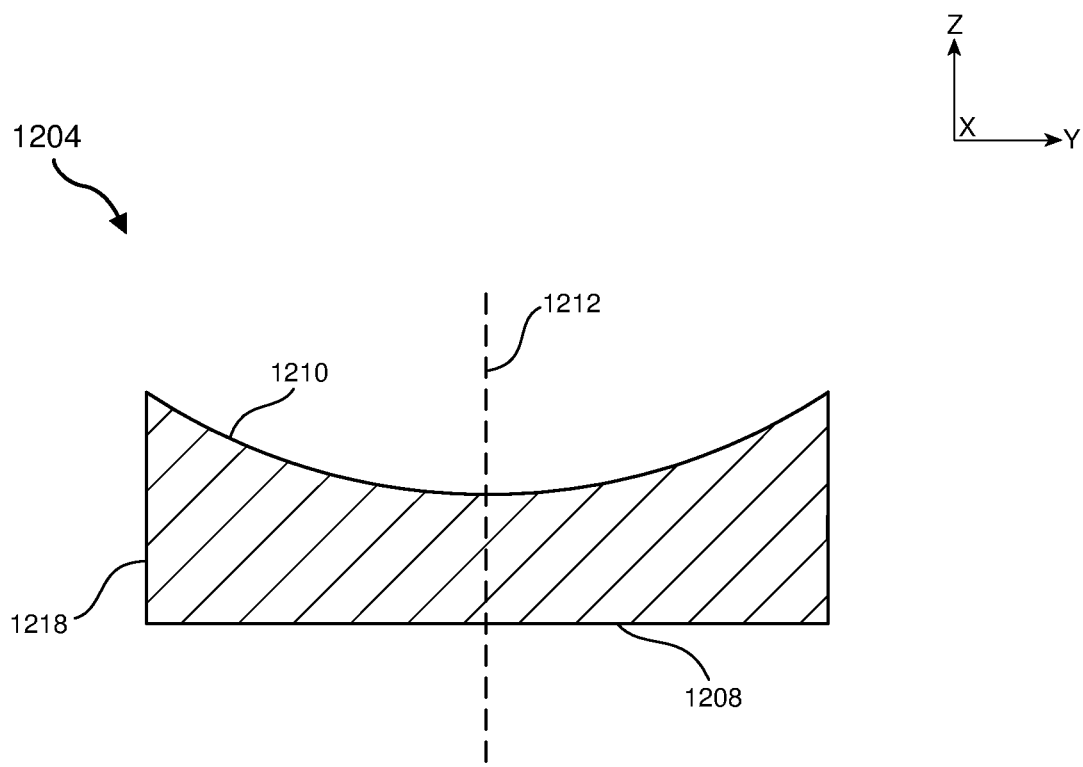
FIG. 12 is an illustration of an example lens element that may be utilized as a precursor element for forming a GRIN lens in accordance with some embodiments.
Figure 13:
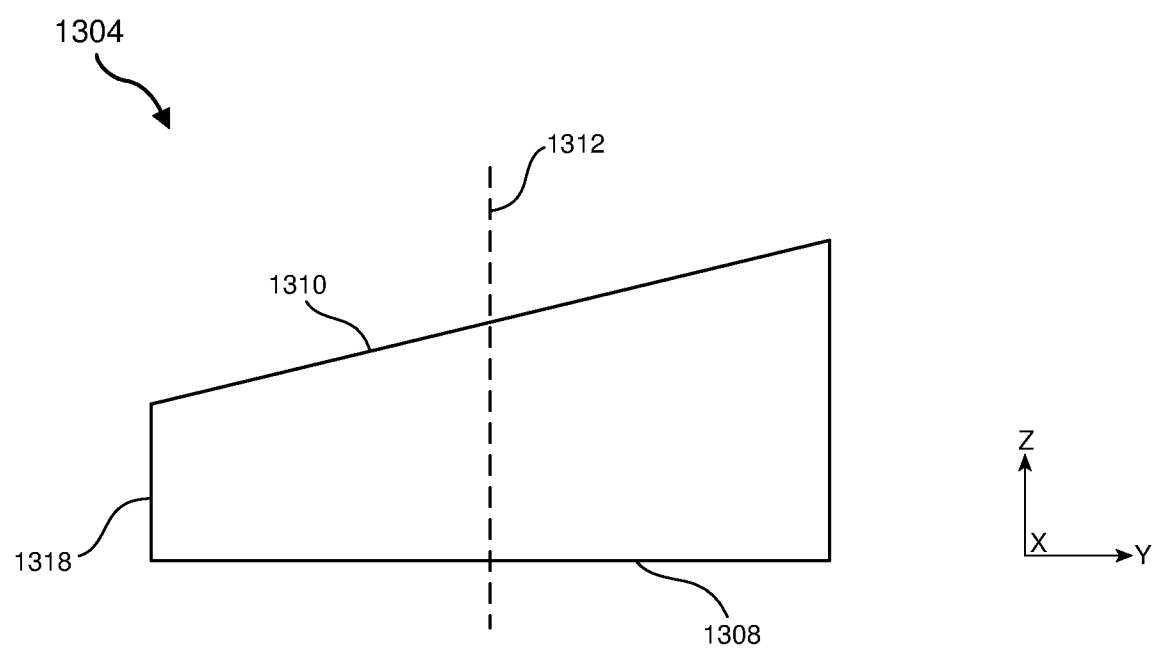
FIG. 13 is an illustration of an example prism element that may be utilized as a precursor element for forming a GRIN prism in accordance with some embodiments.

In addition to the GRIN optical elements and precursor optical elements shown in the preceding figures, various other types of GRIN lenses and/or other GRIN optical elements, such as GRIN prisms, may be produced in accordance with any suitable technique described herein. FIGS. 11-13 illustrate exemplary precursor optical elements that may be utilized to produce corresponding GRIN optical limits having refractive characteristics that are substantially the same as, or similar to, refractive characteristics of the illustrated precursor optical elements, in accordance with various embodiments.

FIG. 11 shows an exemplary aspheric lens element 1104 that may be utilized to form a GRIN lens with an effective refractive index profile having an aspheric, substantially aspheric, or generally aspheric transition that refracts light in substantially the same, similar, or comparable manner as aspheric lens element 1104. The GRIN lens may be produced by, for example, compressing lens element 1104 along an optical axis 1112 of lens element 1104 (i.e., in a direction parallel to the Z-axis). The resulting GRIN lens may have any suitable shape as described herein, such as a shape having a cylindrical or substantially cylindrical peripheral surface or a shape having any other suitable periphery (see, e.g., FIGS. 2A-2C and 8-10). A GRIN lens having the same or similar refractive index profile may additionally or alternatively be produced according to any other suitable technique disclosed herein (e.g., via lithography, photolithography, 3D printing, etc.). Such aspheric GRIN lenses may be utilized to, for example, focus light so as to reduce or eliminate spherical aberrations.

Lens element 1104 may include a nanovoided material (see, e.g., nanovoided material 114 in FIG. 1B) that includes a plurality of nanovoids defined within a bulk matrix material (e.g., a polymer- and/or silica-based material) such that the nanovoids are selectively dispersed and/or arrayed throughout the bulk matrix material. In at least one example, lens element 1104 may have a first lens surface 1108 that is planar (e.g., aligned along the illustrated X- and Y-axes), substantially planar, or any other suitable surface shape, and a second lens surface 1110 having a selected curvature. For example, as illustrated in FIG. 11, second lens surface 1110 may have a convex curvature (e.g., a spherical, substantially spherical, aspheric, anamorphic, or any other suitable arcuate shape) with a parabolic or substantially parabolic cross-sectional profile at optical axis 1112 and a surrounding region. Additionally, second lens surface 1110 may have a concave curvature at a region adjacent to a lateral periphery of lens element 1104 (e.g., adjacent to a lateral surface 1118) disposed radially outward from optical axis 1112.

FIG. 12 shows an exemplary concave lens element 1204 that may be utilized to form a GRIN lens with an effective refractive index profile having a concave, substantially concave, or generally concave transition that refracts light in substantially the same, similar, or comparable manner as concave lens element 1204. The GRIN lens may be produced by, for example, compressing lens element 1204 along an optical axis 1212 of lens element 1204. The resulting GRIN lens may have any suitable shape as described herein. A GRIN lens having the same or similar refractive index profile may additionally or alternatively be produced according to any other suitable technique disclosed herein. Such GRIN lenses may be utilized to, for example, spread light so as to emit a broadened field of light. Lens element 1204 may include a nanovoided material having a plurality of nanovoids defined within a bulk matrix material (e.g., a polymer- and/or silica-based material) such that the nanovoids are selectively dispersed and/or arrayed throughout the bulk matrix material. In at least one example, lens element 1204 may have a first lens surface 1208 that is planar, substantially planar, or any other suitable surface shape, a second lens surface 1210 having a selected concave curvature, and a lateral surface 1218 extending between first and second lens surfaces 1208 and 1210. For example, as illustrated in FIG. 12, second lens surface 1210 may have a convex curvature (e.g., a spherical, substantially spherical, aspheric, anamorphic, or any other suitable arcuate shape) with a parabolic or substantially parabolic cross-sectional profile.

FIG. 13 shows an exemplary prism element 1304 that may be utilized to form a GRIN prism with an effective refractive index profile having a linear, substantially linear, or generally linear transition that refracts light in substantially the same, similar, or comparable manner as prism element 1304. The GRIN prism may be produced by, for example, compressing prism element 1304 along an axis 1312 (i.e., in a direction parallel to the Z-axis) that is, for example, substantially normal to a surface of prism element 1304, such as first element surface 1308. The resulting GRIN lens may have any suitable shape as described herein. A GRIN prism having the same or similar refractive index profile may additionally or alternatively be produced according to any other suitable technique disclosed herein. Such GRIN prisms may be utilized to, for example, redirect light in optical systems, such as display systems. Prism element 1304 may include a nanovoided material having a plurality of nanovoids defined within a bulk matrix material (e.g., a polymer- and/or silica-based material) such that the nanovoids are selectively dispersed and/or arrayed throughout the bulk matrix material. In at least one example, prism element 1304 may have a first element surface 1308 that is planar or substantially planar, a second element surface 1310 that is planar or substantially planar and nonparallel to first element surface 1308, and a lateral surface 1318 extending between first and second lens surfaces 1308 and 1310. In at least one example, the effective refractive index of a GRIN lens formed from prism element 1304 may vary along a gradient from a lowest effective refractive index at one peripheral side to a highest effective refractive index at an opposite peripheral side.

In some embodiments, a GRIN lens may refract light using a combination of a refractive index gradient and lens surface curvature to direct light in a desired manner. FIG. 14 shows an exemplary GRIN lens 1434 that refracts light using both an effective refractive gradient index corresponding to variations in a nanovoided material and a curved surface that further refracts light entering or exiting GRIN lens 1434. GRIN lens 1434 may be produced in any suitable manner disclosed herein. In at least one embodiment, GRIN lens 1434 may be produced by compressing a precursor lens element having a convex surface, such as, for example, lens element 104 having convex second lens surface 110 (see FIGS. 1A and 1B). In contrast to GRIN lens 204, which is illustrated in FIGS. 2A-2C as having a planar second lens surface 201, GRIN lens 1434 shown in FIG. 14 may have a convex second lens surface 1440 with a more gradual arc (i.e., a lower radius of curvature) than second lens surface 110 of lens element 104. During formation of GRIN lens 1434 from lens element 104, a surface (e.g., a molding member surface) exerting a compressing force against second lens surface 110 during molding may have a concave shape that is complementary to second lens surface 1440 of GRIN lens 1434, thereby molding second lens surface 1440 to the desired shape.

GRIN lens 1434 may include a nanovoided material 1444 with an effective refractive index profile having a substantially parabolic transition, a generally parabolic transition, or any other suitable transition profile. GRIN lens 1434 may be centered about optical axis 1442 and may have a first lens surface 1438 that is planar, substantially planar, or any other suitable surface shape and a second lens surface 1440 having a selected curvature that is less than the degree of curvature of second lens surface 110 of lens element 104. In some examples, GRIN lens 1434 may also have a lateral surface 1418 extending between first and second lens surfaces 1408 and 1410. In some embodiments, the effective refractive index gradient of nanovoided material 1444 and the curvature of second lens surface 1440 may together refract light in substantially the same or similar manner as lens element 104.

FIG. 15 illustrates a flow chart detailing an exemplary method 1500 of manufacturing a GRIN optical element including a nanovoided material in accordance with various embodiments. As shown in this figure, at step 1510, a nanovoided material having an initial optical element shape may be formed, wherein the nanovoided polymer material is transparent. The nanovoided material may include any suitable nanovoided material disclosed herein, such as a nanovoided polymer-based, silica-based, and/or other suitable material. The nanovoided material have any suitable initial optical element shape disclosed herein, including, for example, a lenticular, aspheric, anamorphic, or prism shape, or any other suitable shape (see, e.g., FIGS. 1A, 1B, 4, 5A, and 11-13).

According to some embodiments, the nanovoided material may be formed by preparing a mixture including a curable material and a solvent in accordance with any of the techniques disclosed herein. In at least one example, the mixture may be disposed on a transparent support substrate. The mixture may be processed to form a cured polymer material including at least one non-polymeric component in a plurality of defined regions. At least a portion of the at least one non-polymeric component may then be removed from the cured polymer material to form the nanovoided polymer material having the initial optical element shape.

At step 1520, the nanovoided material may be compressed into a compressed optical element shape having at least one surface that differs in surface shape from a corresponding surface of the initial optical element shape. For example, the nanovoided material may be compressed by an external force to form the nanovoided material into any suitable GRIN lens shape as disclosed herein (see, e.g., FIGS. 2A-3B, 5A-10, and 14). The nanovoided material of the compressed optical element may have a predefined change in refractive index in at least one axis due to a change in at least one of nanovoid size or nanovoid distribution along the at least one axis. For example, the compressed nanovoided material in a resulting GRIN lens may have a refractive index gradient with a predefined change in effective refractive index along at least one axis as described in association with the various embodiments disclosed herein (see, e.g., FIGS. 2A-3B, 5C, and 14). In at least one embodiment, the refractive index of the nanovoided material may vary radially, proceeding from an optical axis to a periphery of the GRIN lens.

The GRIN optical elements and corresponding systems and methods shown and described herein may provide various advantages over conventional optical elements and systems. For example, the disclosed GRIN optical elements may be utilized to direct light in optical systems while requiring a minimal amount of space and reducing or eliminating optical aberrations common to many conventional optical elements. In various embodiments, the disclosed GRIN optical elements may achieve a substantial degree of refraction while requiring little or no air space between exterior surfaces of the GRIN optical elements and other components. The minimized or flat surface profiles of the GRIN optical elements may increase their durability and facilitate the use of protective layers or enclosures to shield the GRIN optical elements from wear, damage, and/or contamination. Additionally, such GRIN optical elements may exhibit optical properties in a single compact optical element that are typically difficult to obtain without more complex multi-lens systems.

Nanovoided Materials

In some embodiments, the nanovoided materials described herein may include a plurality of voids, such as nanovoids. In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the nanovoided materials. The voids and/or nanovoids may be either closed- or open-celled, or a mixture thereof. If they are open-celled, the void size may be the average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, and/or approximately 1000 nm).

In some embodiments, the term "effective density," as used herein, may refer to a parameter that may be obtained using a test method where a uniformly thick layer of a material may be placed between two flat and rigid circular plates. In some embodiments, the diameter of the material being compressed may be at least 100 times the thickness the elastomer material. The diameter of the material may be measured, then the plates may be pressed together to exert a pressure of at least approximately $1 \times 10^6$ Pa on the material and the diameter of the material may be remeasured. The effective density may be determined from an expression ($DR=D\_uncompressed/D\_compressed$), where DR may represent the effective density ratio, D_uncompressed may represent the density of the uncompressed material, and D_compressed may represent the density of the compressed material.

The density of voids within a nanovoided material may vary as a function of position. In some embodiments, the volume fraction of a nanovoided material may vary between 10% and 60%. The structure of the voids may be interconnected (open cell) or the voids may be fully enclosed by the bulk matrix material (closed cell). The voids may be partially filled with a liquid or gas, such as air. The voids may be partially coated with a layer of suitable material. In some embodiments, a nanovoided material may be fabricated using a templating agent, such as a material that directs the structural formation of pores or other structural elements of the nanovoided material. A templating agent may be any phase of matter (solid, liquid, gas). In some embodiments, a templating agent is removed to produce a void.

Lens Assembly and Optical Systems

In some embodiments, the optical elements described herein may include or be mechanically coupled to one or more optical elements. An optical element may include a lens, mirror, prism, holographic element, beam splitter, optical filter, diffraction grating, a display, or other optical element. In some embodiments, an optical element may be coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems). In some embodiment, a lens assembly may include multiple deformable optical elements (e.g., multiple deformable lenses, such as liquid lenses).

Methods of Fabrication

Various fabrication methods are discussed herein. Properties of the nanovoided material may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an nanovoided material.

Methods of forming a nanovoided material include forming layers sequentially (e.g., via vapor deposition, coating, printing, etc.) or simultaneously (e.g., via co-flowing, coextrusion, slot die coating, etc.). Alternatively, the nanovoided materials may be deposited using initiated chemical vapor deposition (iCVD), where, for example, suitable monomers of the desired polymers may be used to form the desired coating. In some embodiments, monomers, oligomers, and/or prepolymers for forming the nanovoided materials may optionally be mixed with a solvent and the solvent may be removed from the nanovoided materials during and/or following curing to form nanovoids within the nanovoided materials.

A method of fabricating a polymer-based nanovoided material may include depositing a curable material onto a substrate, curing the deposited curable material to form the nanovoided material (e.g., including a cured elastomer bulk matrix material). In some embodiments, the cured elastomer material may have a Poisson's ratio of approximately 0.35 or less. In some embodiments, a method of fabricating a nanovoided material may include vaporizing a curable material, or a precursor thereof, where depositing the curable material may include depositing the vaporized curable material onto a substrate. In some embodiments, a method of fabricating a nanovoided material may include printing a polymer or precursor thereof (such as a curable material) onto a substrate. In some embodiments, a method may also include combining a polymer precursor material with at least one other component to form a deposition mixture. In some embodiments, a method may include combining a curable material with particles of a material having a high dielectric constant to form a deposition mixture.

In some embodiments, methods for fabricating a nanovoided material may include masks (e.g., shadow masks) to control the patterns of deposited materials. In some embodiments, the nanovoided material may be fabricated on a surface enclosed by a deposition chamber, which may be evacuated (e.g., using one or more mechanical vacuum pumps to a predetermined level such as 10-6 Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials that are mechanically coupled to the surface. In some embodiments, the surface may be fixed and the deposition and curing systems may move relative to the surface, or both the surface, the deposition, and/or curing systems may be moving simultaneously.

In some embodiments, an inlet to a deposition chamber may open and may input an appropriate monomer initiator for starting a chemical reaction. In some embodiments, "monomer," as used herein, may refer to a monomer that forms a given polymer (i.e., as part of a nanovoided material). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable materials may be cured with a source of radiation (e.g., electromagnetic radiation, such as UV and/or visible light) to form a nanovoided material that includes a cured elastomer material. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form a nanovoided material. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured material may include at least one non-polymeric component in a plurality of defined regions and a method may further include removing at least a portion of the at least one non-polymeric component from the cured elastomer material to form a voided (e.g., nanovoided) polymer element.

In some embodiments, the deposition of materials (e.g., monomers, oligomers, monomer initiators, conductive materials, etc.) of a nanovoided material may be performed using a deposition process, such as chemical vapor deposition (CVD). CVD may refer to a vacuum deposition method used to produce high-quality, high-performance, solid materials. In CVD, a substrate may be exposed to one or more precursors, which may react and/or decompose on the substrate surface to produce the desired deposit. Frequently, volatile by-products are also produced, which may be removed by gas flow through the chamber.

In some embodiments, a nanovoided material may be fabricated using an atmospheric pressure CVD (APCVD) coating formation technique (e.g., CVD at atmospheric pressure). In some embodiments, a nanovoided material may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately 10-6 Pa (equivalently, approximately 10-8 torr)).

In some embodiments, a nanovoided material may be fabricated using an aerosol assisted CVD (AACVD) process (e.g., a CVD in which the precursors are transported) by means of a liquid/gas aerosol, which may be generated ultrasonically or with electrospray. In some embodiments, AACVD may be used with non-volatile precursors. In some embodiments, a nanovoided material may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to form the nanovoided material as in CVD.

DLICVD may be used on liquid or solid precursors, and high growth rates for the deposited materials may be reached using this technique.

In some embodiments, a nanovoided material may be fabricated using a hot wall CVD process (e.g., CVD in which the deposition chamber is heated by an external power source and the nanovoided material or precursor mixture is heated by radiation from the heated wall of the deposition chamber). In another aspect, a nanovoided material may be fabricated using a cold wall CVD process (e.g., a CVD in which only the nanovoided material or precursor mixture is directly heated, for example, by induction, while the walls of the chamber are maintained at room temperature).

In some embodiments, a nanovoided material may be fabricated using a microwave plasma-assisted CVD (MPCVD) process, where microwaves are used to enhance chemical reaction rates of the precursors. In another aspect, a nanovoided material may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the nanovoided material or in depositing certain materials (e.g., organic materials and/or some polymers).

In some embodiments, a nanovoided material may be fabricated using a remote plasma-enhanced CVD (RPECVD) process. In some embodiments, RPECVD may be similar to PECVD except that the nanovoided material or precursor may not be directly in the plasma discharge region. In some embodiments, the removal of the nanovoided material from the plasma region may allow for the reduction of processing temperatures down to room temperature.

In some embodiments, a nanovoided material may be fabricated using an atomic-layer CVD (ALCVD) process. In some embodiments, ALCVD may deposit successive layers of different substances to produce layered, crystalline film coatings on the nanovoided material.

In some embodiments, a nanovoided material may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the nanovoided material.

In some embodiments, a nanovoided material may be fabricated using a hot filament CVD (HFCVD) process, which may also be referred to as catalytic CVD (cat-CVD) or initiated CVD (iCVD). In some embodiments, this process may use a hot filament to chemically decompose the source gases to form components of the nanovoided material. Moreover, the filament temperature and temperature of portions of the nanovoided material or precursors may be independently controlled, allowing colder temperatures for better adsorption rates at the location of the nanovoided material or precursors, and higher temperatures necessary for decomposition of precursors to free radicals at the filament.

In some embodiments, a nanovoided material may be fabricated using a hybrid physical-chemical vapor deposition (HPCVD) process. HPCVD may involve both chemical decomposition of precursor gas and vaporization of a solid source to form the nanovoided material.

In some embodiments, a nanovoided material may be fabricated using a rapid thermal CVD (RTCVD) process. This CVD process uses heating lamps or other methods to rapidly heat the nanovoided material. Heating only the nanovoided material rather than the precursors or chamber walls may reduce unwanted gas-phase reactions that may lead to particle formation in the nanovoided material.

In some embodiments, a nanovoided material may be fabricated using a photo-initiated CVD (PICVD) process. This process may use UV light to stimulate chemical reactions in the precursor materials used to form the nanovoided material. Under certain conditions, PICVD may be operated at or near atmospheric pressure.

In some embodiments, nanovoided materials may be fabricated by depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, nanovoids may be formed in the nanovoided material. In some embodiments, a flowable material (e.g., a solvent) may be combined with the curable materials (e.g., monomers and conductive materials) to create a flowable mixture that may be used for producing nanovoided materials. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, a flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component. Alternatively, the flowable material (e.g., solvent) may be introduced into a vaporizer to deposit (e.g., via vaporization or, in alternative embodiments, via printing) a curable material onto a substrate. In some embodiments, a flowable material (e.g., solvent) may be deposited as a separate layer either on top or below a curable material (e.g., a monomer) and the solvent and curable material may be allowed to diffuse into each other before being cured by the source of radiation to generate a nanovoided material. In some embodiments, after the curable material is cured, the solvent may be allowed to evaporate before further processing. In some embodiments, the evaporation of the solvent may be accelerated by the application of heat to the surface with a heater, which may, for example, by disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers and may at least partially phase separate when condensed on the substrate. In some embodiments, a system may include multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided material may include co-depositing a monomer or mixture of monomers, a surfactant, and a nonsolvent material associated with the monomer(s), which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (for example sorbitane monooleate). In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

Application to Artificial Reality Systems

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 1600 in FIG. 16. Other artificial reality systems may include a NED that also provides visibility into the real world (e.g., augmented-reality system 1700 in FIG. 17) or that visually immerses a user in an artificial reality (e.g., virtual-reality system 1800 in FIG. 18). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Turning to FIG. 16, augmented-reality system 1600 generally represents a wearable device dimensioned to fit about a body part (e.g., a head) of a user. As shown in FIG. 16, system 1600 may include a frame 1602 and a camera assembly 1604 that is coupled to frame 1602 and configured to gather information about a local environment by observing the local environment. Augmented-reality system 1600 may also include one or more audio devices, such as output audio transducers 1608(A) and 1608(B) and input audio transducers 1610. Output audio transducers 1608(A) and 1608(B) may provide audio feedback and/or content to a user, and input audio transducers 1610 may capture audio in a user's environment.

As shown, augmented-reality system 1600 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1600 may not include a NED, augmented-reality system 1600 may include other types of screens or visual feedback devices (e.g., a display screen integrated into a side of frame 1602).

The embodiments discussed in this disclosure may also be implemented in augmented-reality systems that include one or more NEDs. For example, as shown in FIG. 17, augmented-reality system 1700 may include an eyewear device 1702 with a frame 1710 configured to hold a left display device 1715(A) and a right display device 1715(B) in front of a user's eyes. Display devices 1715(A) and 1715(B) may act together or independently to present an image or series of images to a user. While augmented-reality system 1700 includes two displays, embodiments of this disclosure may be implemented in augmented-reality systems with a single NED or more than two NEDs.

In some embodiments, augmented-reality system 1700 may include one or more sensors, such as sensor 1740. Sensor 1740 may generate measurement signals in response to motion of augmented-reality system 1700 and may be located on substantially any portion of frame 1710. Sensor 1740 may represent a position sensor, an inertial measurement unit (IMU), a depth camera assembly, or any combination thereof. In some embodiments, augmented-reality system 1700 may or may not include sensor 1740 or may include more than one sensor. In embodiments in which sensor 1740 includes an IMU, the IMU may generate calibration data based on measurement signals from sensor 1740. Examples of sensor 1740 may include, without limitation, accelerometers, gyroscopes, magnetometers, other suitable types of sensors that detect motion, sensors used for error correction of the IMU, or some combination thereof.

Augmented-reality system 1700 may also include a microphone array with a plurality of acoustic transducers 1720(A)-1720(J), referred to collectively as acoustic transducers 1720. Acoustic transducers 1720 may be transducers that detect air pressure variations induced by sound waves. Each acoustic transducer 1720 may be configured to detect sound and convert the detected sound into an electronic format (e.g., an analog or digital format). The microphone array in FIG. 17 may include, for example, ten acoustic transducers: 1720(A) and 1720(B), which may be designed to be placed inside a corresponding ear of the user, acoustic transducers 1720(C), 1720(D), 1720(E), 1720(F), 1720(G), and 1720(H), which may be positioned at various locations on frame 1710, and/or acoustic transducers 1720(I) and 1720(J), which may be positioned on a corresponding neckband 1705.

In some embodiments, one or more of acoustic transducers 1720(A)-(F) may be used as output transducers (e.g., speakers). For example, acoustic transducers 1720(A) and/or 1720(B) may be earbuds or any other suitable type of headphone or speaker.

The configuration of acoustic transducers 1720 of the microphone array may vary. While augmented-reality system 1700 is shown in FIG. 17 as having ten acoustic transducers 1720, the number of acoustic transducers 1720 may be greater or less than ten. In some embodiments, using higher numbers of acoustic transducers 1720 may increase the amount of audio information collected and/or the sensitivity and accuracy of the audio information. In contrast, using a lower number of acoustic transducers 1720 may decrease the computing power required by the controller 1750 to process the collected audio information. In addition, the position of each acoustic transducer 1720 of the microphone array may vary. For example, the position of an acoustic transducer 1720 may include a defined position on the user, a defined coordinate on frame 1710, an orientation associated with each acoustic transducer, or some combination thereof.

Acoustic transducers 1720(A) and 1720(B) may be positioned on different parts of the user's ear, such as behind the pinna or within the auricle or fossa. Or, there may be additional acoustic transducers on or surrounding the ear in addition to acoustic transducers 1720 inside the ear canal. Having an acoustic transducer positioned next to an ear canal of a user may enable the microphone array to collect information on how sounds arrive at the ear canal. By positioning at least two of acoustic transducers 1720 on either side of a user's head (e.g., as binaural microphones), augmented-reality device 1700 may simulate binaural hearing and capture a 3D stereo sound field around about a user's head. In some embodiments, acoustic transducers 1720(A) and 1720(B) may be connected to augmented-reality system 1700 via a wired connection 1730, and in other embodiments, acoustic transducers 1720(A) and 1720(B) may be connected to augmented-reality system 1700 via a wireless connection (e.g., a Bluetooth connection). In still other embodiments, acoustic transducers 1720(A) and 1720(B) may not be used at all in conjunction with augmented-reality system 1700.

Acoustic transducers 1720 on frame 1710 may be positioned along the length of the temples, across the bridge, above or below display devices 1715(A) and 1715(B), or some combination thereof. Acoustic transducers 1720 may be oriented such that the microphone array is able to detect sounds in a wide range of directions surrounding the user wearing the augmented-reality system 1700. In some embodiments, an optimization process may be performed during manufacturing of augmented-reality system 1700 to determine relative positioning of each acoustic transducer 1720 in the microphone array.

In some examples, augmented-reality system 1700 may include or be connected to an external device (e.g., a paired device), such as neckband 1705. Neckband 1705 generally represents any type or form of paired device. Thus, the following discussion of neckband 1705 may also apply to various other paired devices, such as charging cases, smart watches, smart phones, wrist bands, other wearable devices, hand-held controllers, tablet computers, laptop computers and other external compute devices, etc.

As shown, neckband 1705 may be coupled to eyewear device 1702 via one or more connectors. The connectors may be wired or wireless and may include electrical and/or non-electrical (e.g., structural) components. In some cases, eyewear device 1702 and neckband 1705 may operate independently without any wired or wireless connection between them. While FIG. 17 illustrates the components of eyewear device 1702 and neckband 1705 in example locations on eyewear device 1702 and neckband 1705, the components may be located elsewhere and/or distributed differently on eyewear device 1702 and/or neckband 1705. In some embodiments, the components of eyewear device 1702 and neckband 1705 may be located on one or more additional peripheral devices paired with eyewear device 1702, neckband 1705, or some combination thereof. Furthermore, Pairing external devices, such as neckband 1705, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1700 may be provided by a paired device or shared between a paired device and an eyewear device, thus reducing the weight, heat profile, and form factor of the eyewear device overall while still retaining desired functionality. For example, neckband 1705 may allow components that would otherwise be included on an eyewear device to be included in neckband 1705 since users may tolerate a heavier weight load on their shoulders than they would tolerate on their heads. Neckband 1705 may also have a larger surface area over which to diffuse and disperse heat to the ambient environment. Thus, neckband 1705 may allow for greater battery and computation capacity than might otherwise have been possible on a stand-alone eyewear device. Since weight carried in neckband 1705 may be less invasive to a user than weight carried in eyewear device 1702, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1705 may be communicatively coupled with eyewear device 1702 and/or to other devices. These other devices may provide certain functions (e.g., tracking, localizing, depth mapping, processing, storage, etc.) to augmented-reality system 1700. In the embodiment of FIG. 17, neckband 1705 may include two acoustic transducers (e.g., 1720(I) and 1720(J)) that are part of the microphone array (or potentially form their own microphone subarray). Neckband 1705 may also include a controller 1725 and a power source 1735.

Acoustic transducers 1720(I) and 1720(J) of neckband 1705 may be configured to detect sound and convert the detected sound into an electronic format (analog or digital). In the embodiment of FIG. 17, acoustic transducers 1720(I) and 1720(J) may be positioned on neckband 1705, thereby increasing the distance between the neckband acoustic transducers 1720(I) and 1720(J) and other acoustic transducers 1720 positioned on eyewear device 1702. In some cases, increasing the distance between acoustic transducers 1720 of the microphone array may improve the accuracy of beam-forming performed via the microphone array. For example, if a sound is detected by acoustic transducers 1720(C) and 1720(D) and the distance between acoustic transducers 1720(C) and 1720(D) is greater than, e.g., the distance between acoustic transducers 1720(D) and 1720(E), the determined source location of the detected sound may be more accurate than if the sound had been detected by acoustic transducers 1720(D) and 1720(E).

Controller 1725 of neckband 1705 may process information generated by the sensors on 1705 and/or augmented-reality system 1700. For example, controller 1725 may process information from the microphone array that describes sounds detected by the microphone array. For each detected sound, controller 1725 may perform a direction-of-arrival (DOA) estimation to estimate a direction from which the detected sound arrived at the microphone array. As the microphone array detects sounds, controller 1725 may populate an audio data set with the information. In embodiments in which augmented-reality system 1700 includes an inertial measurement unit, controller 1725 may compute all inertial and spatial calculations from the IMU located on eyewear device 1702. A connector may convey information between augmented-reality system 1700 and neckband 1705 and between augmented-reality system 1700 and controller 1725. The information may be in the form of optical data, electrical data, wireless data, or any other transmittable data form. Moving the processing of information generated by augmented-reality system 1700 to neckband 1705 may reduce weight and heat in eyewear device 1702, making it more comfortable to the user.

Power source 1735 in neckband 1705 may provide power to eyewear device 1702 and/or to neckband 1705. Power source 1735 may include, without limitation, lithium ion batteries, lithium-polymer batteries, primary lithium batteries, alkaline batteries, or any other form of power storage. In some cases, power source 1735 may be a wired power source. Including power source 1735 on neckband 1705 instead of on eyewear device 1702 may help better distribute the weight and heat generated by power source 1735.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1800 in FIG. 18, that mostly or completely covers a user's field of view. Virtual-reality system 1800 may include a front rigid body 1802 and a band 1804 shaped to fit around a user's head. Virtual-reality system 1800 may also include output audio transducers 1806(A) and 1806(B). Furthermore, while not shown in FIG. 18, front rigid body 1802 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1800 and/or virtual-reality system 1800 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1700 and/or virtual-reality system 1800 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1600, augmented-reality system 1700, and/or virtual-reality system 1800 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 16 and 18, output audio transducers 1608 (A), 1608(B), 1806(A), and 1806(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1610 may include condenser microphones, dynamic microphones, ribbon microphones, and/or any other type or form of input transducer. In some embodiments, a single transducer may be used for both audio input and audio output.

While not shown in FIGS. 16-18, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An optical array comprising:
    a plurality of graded-index optical elements each comprising a nanovoided material having a first surface and a second surface opposite the first surface, wherein:
        the nanovoided material is transparent between the first surface and the second surface; and
        the nanovoided material has a predefined change in effective refractive index in at least one axis due to a change in at least one of nanovoid size or nanovoid distribution along the at least one axis.

2. The optical array of claim 1, wherein each of the plurality of graded-index optical elements are disposed on a surface of a transparent support substrate.

3. The optical array of claim 2, wherein:
    the first surfaces of the plurality of graded-index optical elements face the transparent support substrate; and
    the second surfaces of the plurality of graded-index optical elements are substantially parallel.

4. The optical array of claim 2, further comprising a transparent protective material disposed on a side of each of the plurality of graded-index optical elements opposite the transparent support substrate.

5. The optical array of claim 1, wherein at least one of the first surface or the second surface of each of the plurality of graded-index optical elements is substantially planar.

6. The optical array of claim 1, wherein each of the plurality of gradient-index optical elements comprises at least one of a lens or a prism.

* * * * *